(12) United States Patent
Konno et al.

(10) Patent No.: US 9,831,064 B2
(45) Date of Patent: Nov. 28, 2017

(54) PLASMA PROCESSING APPARATUS

(71) Applicants: Tokyo Electron Limited, Tokyo (JP); Daihen Corporation, Osaka-shi, Osaka (JP)

(72) Inventors: Hiroo Konno, Miyagi (JP); Takashi Shimomoto, Osaka (JP)

(73) Assignees: TOKYO ELECTRON LIMITED, Tokyo (JP); DAIHEN CORPORATION, Osaka-shi, Osaka (JP)

( * ) Notice: Subject to any disclaimer, the term of this patent is extended or adjusted under 35 U.S.C. 154(b) by 492 days.

(21) Appl. No.: 14/526,900

(22) Filed: Oct. 29, 2014

(65) Prior Publication Data

US 2015/0122420 A1  May 7, 2015

(30) Foreign Application Priority Data

Nov. 5, 2013 (JP) ................. 2013-229382

(51) Int. Cl.
*H01J 37/32* (2006.01)
(52) U.S. Cl.
CPC .. *H01J 37/32146* (2013.01); *H01J 37/32155* (2013.01); *H01J 37/32165* (2013.01); *H01J 37/32926* (2013.01); *H01J 37/32935* (2013.01); *H01J 2237/327* (2013.01); *H01J 2237/334* (2013.01); *H01J 2237/3321* (2013.01)

(58) Field of Classification Search
CPC .......... H01J 37/32146; H01J 37/32935; H01J 37/32926; H01J 37/32155; H01J 37/32825; H01J 2237/24564; H01J 2237/327; H01J 2237/334; H01J 2237/3321; H01J 37/32165
See application file for complete search history.

(56) References Cited

FOREIGN PATENT DOCUMENTS

| JP | 2000-071292 A | 3/2000 |
|---|---|---|
| JP | 2012-009544 A | 1/2012 |
| JP | 2013-033856 A | 2/2013 |

*Primary Examiner* — Yuechuan Yu
(74) *Attorney, Agent, or Firm* — Pearne & Gordon LLP

(57) ABSTRACT

A plasma processing apparatus can control a ratio between an input power during a pulse-on period and an input power during a pulse-off period by a matching operation of a matching device provided on a high frequency transmission line for supplying the high frequency power as a continuous wave without a power modulation. An impedance sensor 96A provided in a matching device of a plasma generation system includes a RF voltage detector 100; a voltage-detection-signal generating circuit 102; an arithmetic-average-value calculating circuit 104; a weighted-average-value calculating circuit 106; and a moving-average-value calculating unit 108 of a voltage sensor system, and also includes a RF electric current detector 110; an electric current-detection-signal generating circuit 112; an arithmetic-average-value calculating circuit 114; a weighted-average-value calculating circuit 116; a moving-average-value calculating unit 118; and an impedance calculating circuit 120 of an electric current sensor system.

13 Claims, 18 Drawing Sheets

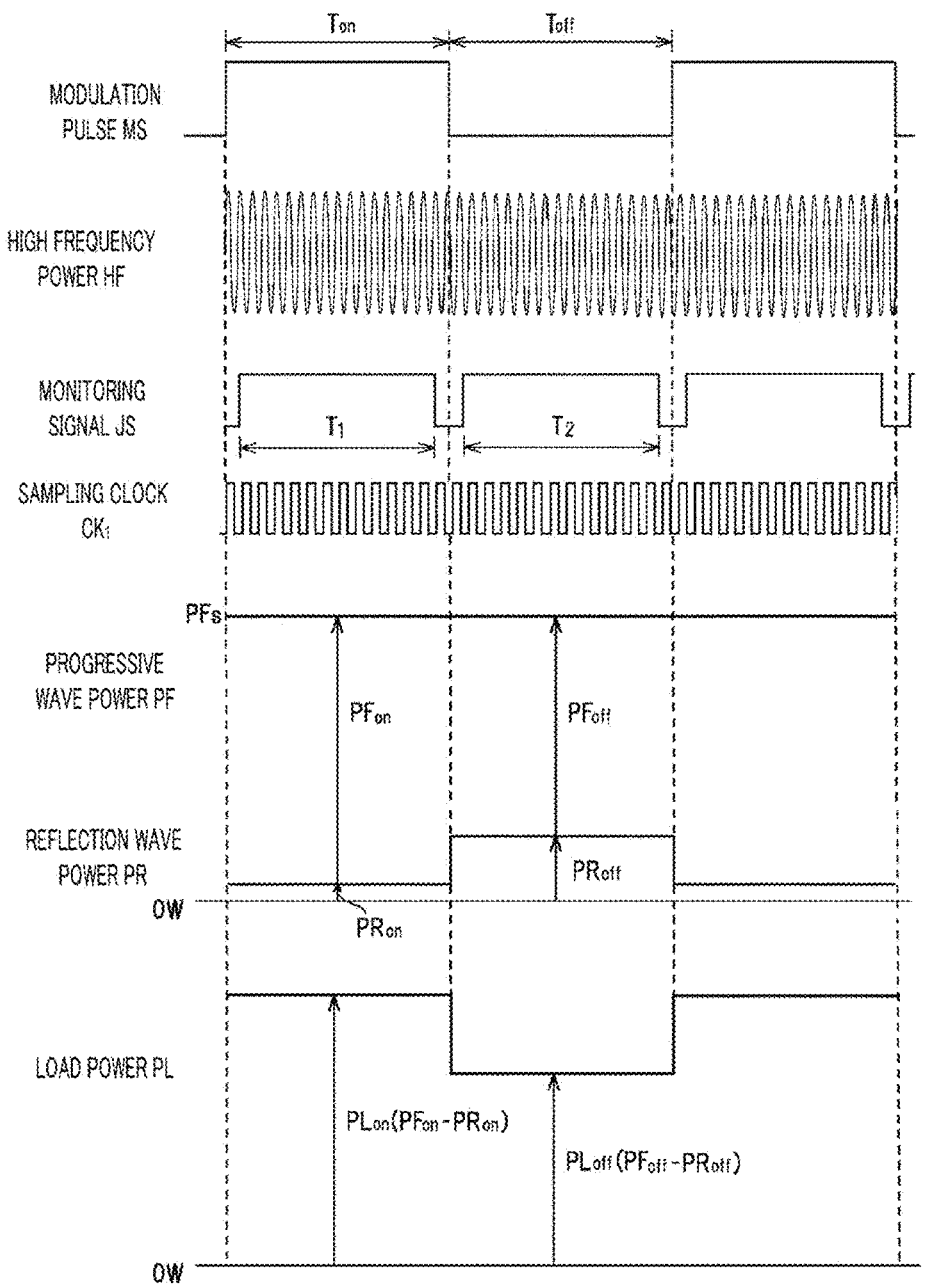

[ 0.5 < K < 1 ]

[ K = 1 ]

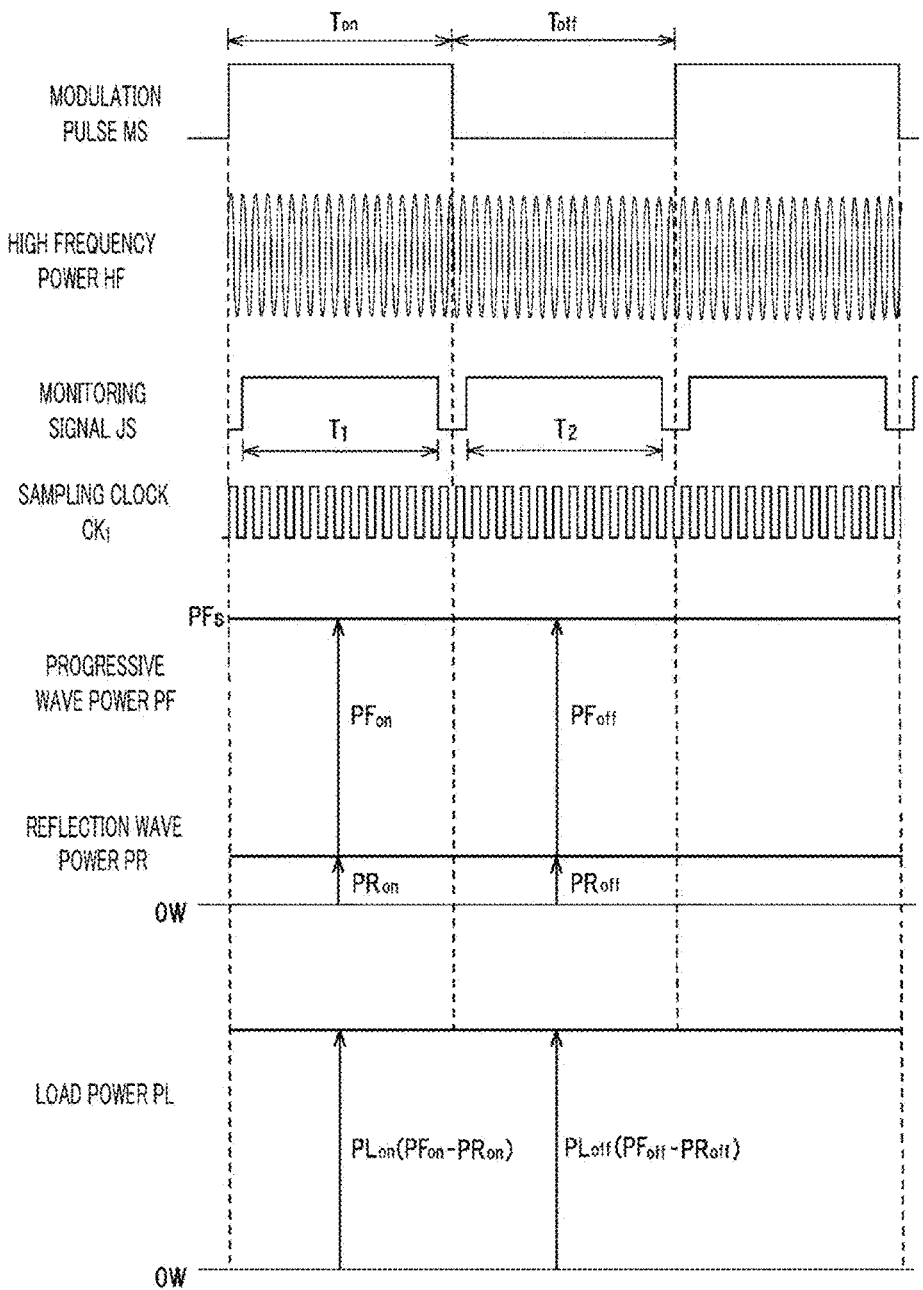

[ K = 0.5 ]

[K = 0]

[ K = 0.8 ]

PLASMA PROCESSING APPARATUS

CROSS-REFERENCE TO RELATED APPLICATION

This application claims the benefit of Japanese Patent Application No. 2013-229382 filed on Nov. 5, 2013, the entire disclosures of which are incorporated herein by reference.

TECHNICAL FIELD

The embodiments described herein pertain generally to a technique of performing a plasma process on a processing target object; and, more particularly, to a power modulation type plasma processing apparatus of pulse-modulating either one of two kinds of high frequency powers to be supplied into a processing vessel.

BACKGROUND

Generally, in a plasma processing apparatus, plasma of a processing gas is generated within a decompression processing vessel. Further, a thin film is formed on a processing target object within the processing vessel by a gas phase reaction or a surface reaction of radicals or ions included in the generated plasma, or micro-processing such as etching of a material or a thin film on a surface of the processing target object is performed.

For example, a capacitively coupled plasma processing apparatus includes an upper electrode and a lower electrode arranged in parallel to each other within a processing vessel. A processing target object (e.g., a semiconductor wafer, a glass substrate, etc) is mounted on the lower electrode, and a high frequency power having a frequency (typically, 13.56 MHz or higher) suitable for plasma generation is applied to the upper electrode or the lower electrode. Electrons are accelerated in a high frequency electric field generated between the two facing electrodes by applying the high frequency power, and plasma is generated as a result of ionization by collision between the electrons and a processing gas.

Recently, as a design rule is getting more miniaturized in a manufacturing process of a semiconductor device or the like, higher level of dimensional accuracy is required in, especially, the plasma etching. Further, it is required to increase etching selectivity against a mask or an underlying film and to improve etching uniformity in the entire surface of a substrate. For this reason, a pressure and ion energy in a processing region within a chamber tends to be reduced, so that a high frequency power having a high frequency equal to or higher than 40 MHz is used.

However, as the pressure and the ion energy are reduced, an influence of a charging damage, which has been negligible conventionally, can be no more neglected. That is, in a conventional plasma processing apparatus having the high ion energy, no serious problem may occur even when a plasma potential is non-uniform in the entire surface of the substrate. However, if the ion energy is lowered at a lower pressure, the non-uniformity of the plasma potential in the entire surface of the substrate may easily cause the charging damage on a gate oxide film.

In this regard, to solve the above-mentioned problem, a method of pulse-modulating a high frequency power for plasma generation with an on/off (or H level/L level) pulse having a controllable duty ratio (hereinafter, referred to as "first power modulation method") has been considered effective. According to this first power modulation method, a plasma generation state in which plasma of a processing gas is being generated and a plasma non-generation state in which the plasma is not being generated are alternately repeated at a preset cycle during a plasma etching process. Accordingly, as compared to a typical plasma process in which plasma is continuously generated from the beginning of the process to the end thereof, a time period during which plasma is continuously generated may be shortened. As a result, the amount of electric charges introduced into a processing target object from the plasma at one time or the amount of electric charges accumulated on the surface of the processing target object may be reduced, so that the charging damage is suppressed from being generated. Therefore, a stable plasma process can be performed and reliability of the plasma process can be improved.

Further, conventionally, in the plasma processing apparatus, a RF bias method is widely employed. In this RF bias method, a high frequency power having a relatively low frequency (typically, 13.56 MHz or lower) is applied to the lower electrode on which the processing target object is mounted, and ions in plasma are accelerated and attracted to the processing target object by a negative bias voltage or a sheath voltage generated on the lower electrode. In this way, by accelerating the ions in the plasma and bringing them into collision with the surface of the processing target object, a surface reaction, an anisotropic etching or a film modification may be facilitated.

However, when performing the etching process to form via holes or contact holes by using the plasma etching apparatus, a so-called micro-loading effect may occur. That is, an etching rate may differ depending on the hole size, so that it is difficult to control an etching depth. Especially, the etching rate tends to be higher at a large area such as a guide ring (GR), whereas the etching rate tends to be lower at a small via into which CF-based radicals are difficult to be introduced.

In this regard, to solve the above-stated problem, a method of pulse-modulating a high frequency power used for ion attraction with an on/off (or H level/L level) pulse having a controllable duty ratio (hereinafter, referred to as "second power modulation method") has been considered effective. According to the second power modulation method, a pulse-on period during which an on-state (or H-level state) of a relatively high power suitable for etching a preset film on the processing target object is maintained and a pulse-off period during which an off-state (or L-level state) of a relatively low power (a high frequency power for ion attraction) suitable for depositing polymer on a preset film on the processing target object is maintained are alternately repeated at a certain cycle. Accordingly, at an area having a larger hole size, a proper polymer layer may be deposited on the preset film at a higher deposition rate, so that the etching may be suppressed. Thus, an undesirable micro-loading effect may be reduced, and it may be possible to perform an etching process with a high selectivity and a high etching rate.

Patent Document 1: Japanese Patent Laid-open Publication No. 2000-071292
Patent Document 2: Japanese Patent Laid-open Publication No. 2012-009544
Patent Document 3: Japanese Patent Laid-open Publication No. 2013-033856

When using the first power modulation method or the second power modulation method in a plasma process, a high frequency power to be pulse-modulated varies in a step-shape between the on-state (or H-level state) and the off-state (or L-level state) of a modulation pulse, so that plasma of a load greatly pulsates periodically. Accordingly, in a matching device that transfers a high frequency power as a continuous wave without undergoing power modulation to the load (plasma) within a chamber, a matching operation may not be performed stably, and it may be difficult to achieve expected effect of the corresponding power modulation methods.

By way of example, in the second power modulation method, on the assumption that a high frequency power for plasma generation as a continuous wave without the power modulation is stably supplied to plasma at a regular input power, it is expected that an etching process is performed during the pulse-on period and deposition of a reaction product or exhaust and removal of a reaction by-product is performed during the off-period. Here, the input power of the high frequency power is a net power obtained by subtracting a power of a reflection wave or a power of a high frequency power supply, from a power of a progressive wave and is also called a "load power."

If, however, the plasma of load varies between the pulse-on period and the pulse-off period as stated above, the power of the reflection wave may also vary on a high frequency transmission line for transmitting the high frequency power for plasma generation as the continuous wave, so that the input power may be changed. In this case, if the input power of the high frequency power for plasma generation is greatly reduced during the pulse-on period, the etching process may not be performed as expected. If the input power of the high frequency power for plasma generation is greatly reduced during the pulse-off period, the plasma may be unstable.

Further, conventionally, the matching device that transmits a high frequency power as a continuous wave without the power modulation to the load samples voltage detection signals and electric current detection signals obtained on the high frequency transmission line of the high frequency power with the same sampling frequency during the pulse-on period and the pulse-off period, and calculates a load impedance measurement value corresponding to an arithmetic average of the total samples within a single cycle. Then, the matching device controls a variable reactance element within a matching circuit, e.g., varies a capacitance of a variable capacitor such that the load impedance measurement value (arithmetic average value or moving average value thereof) can be made equal to or approximate to a matching point corresponding to an output impedance of a high frequency power supply. Accordingly, the degree of matching may differ between the pulse-on period and the pulse-off period depending on the lengths of the periods or the lengths of the sampling time (magnitude of the number of the samples). The degree of matching in a longer period may be relatively closer to a fully matched state than that in a short period. From another point of view, in the pulse-on period and the pulse-off period, an offset amount of a load impedance during a relatively longer period from the matching point is lower than an offset amount of a load impedance during a relatively shorter period.

If the duty ratio of the modulation pulse is varied in the power modulation method, a ratio between the lengths of the pulse-on period and the pulse-off period may be changed, and the load impedance measurement value (matching target point) which is matched with the matching point may also be changed by being affected by the change of the duty ratio. Accordingly, a balance between the offset amount of the load impedance during the pulse-on period and the offset amount of the load impedance during the pulse-off period from the matching point may be changed in the matching operation. As a result, a ratio between an input power during the pulse-on period and an input power during the pulse-off period may be changed.

As stated above, conventionally, it has been difficult to control the ratio between the input powers during the pulse-on period and the pulse-off period for the high frequency power as a continuous wave without the power modulation regardless of the duty ratio of the pulse modulation.

SUMMARY

In view of the foregoing, example embodiments provide a plasma processing apparatus in which, when pulse-modulating either one of two kinds of high frequency powers to be supplied into a processing vessel, a ratio between an input power during a pulse-on period and an input power during a pulse-off period can be controlled as required by a matching operation of a matching device provided on a high frequency transmission line for supplying a high frequency power as a continuous wave without power modulation, and expected effects of the power modulation method can be optimized.

In an example embodiment, a plasma processing apparatus generates plasma by high frequency discharge of a processing gas within a decompression processing vessel that accommodates therein a processing target object, which is loaded into and unloaded from the processing vessel, and performs a process on the processing target object within the processing vessel under the plasma. The plasma processing apparatus includes a first high frequency power supply configured to output a first high frequency power; a first high frequency transmission line configured to transmit the first high frequency power outputted from the first high frequency power supply to a first electrode provided within or in the vicinity of the processing vessel; a first matching device, having a variable reactance element provided on the first high frequency transmission line and a first impedance sensor configured to measure a load impedance on the first high frequency transmission line with respect to the first high frequency power supply, configured to control a reactance of the variable reactance element such that a load impedance measurement value outputted from the first impedance sensor is equal to or approximate to a matching point corresponding to an output impedance of the first high frequency power supply; a second high frequency power supply configured to output a second high frequency power; a second high frequency transmission line configured to transmit the second high frequency power outputted from the second high frequency power supply to the first electrode or a second electrode provided within or in the vicinity of the processing vessel; and a power modulation unit configured to pulse-modulate an output of the second high frequency power supply with a pulse such that a pulse-on period during which the second high frequency power is turned on or has a first level and a pulse-off period during which the second high frequency power is turned off or has a second level lower than the first level are repeated alternately at a regular frequency. Further, the first impedance sensor outputs the load impedance measurement value corresponding to a weighted average value obtained by weighted-averaging an average value of the load impedance during the pulse-on period and an average value of the load impedance during the pulse-off period with a preset weighted value independent from a duty ratio of the pulse.

In the above configuration, the load impedance measurement value obtained from the first impedance sensor depends on the weighted value of the weighted averaging, not on the duty ratio of the modulation pulse. In the first matching device in which the load impedance measurement value is set as the matching target point, an offset amount of the load impedance during the pulse-on period and an offset amount of the load impedance during the pulse-off period with respect to the matching point is controlled by selecting the weighted value of the weighted averaging within a regular range, so that a ratio between an input power during the pulse-on period and an input power during the pulse-off period can be controlled as required.

In the plasma processing apparatuses in accordance with the example embodiments, with the above-described configuration and operation, when pulse-modulating either one of two kinds of high frequency powers to be supplied into the processing vessel, it is possible to vary a ratio between an input power during a pulse-on period and an input power during a pulse-off period as required by a matching operation of the matching device provided on the high frequency transmission line for transmitting a high frequency power as a continuous wave without the power modulation. Therefore, expected effects of the power modulation method can be optimized.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 6A are diagrams showing waveforms of respective components when a weighted variable k for weighted average calculation is selected within a range of 0.5<K≤1 in accordance with the example embodiment;

FIG. 7A are diagrams showing waveforms of respective components when the weighted variable k for weighted averaging is set to be K=0.5;

DETAILED DESCRIPTION

Figure 1:
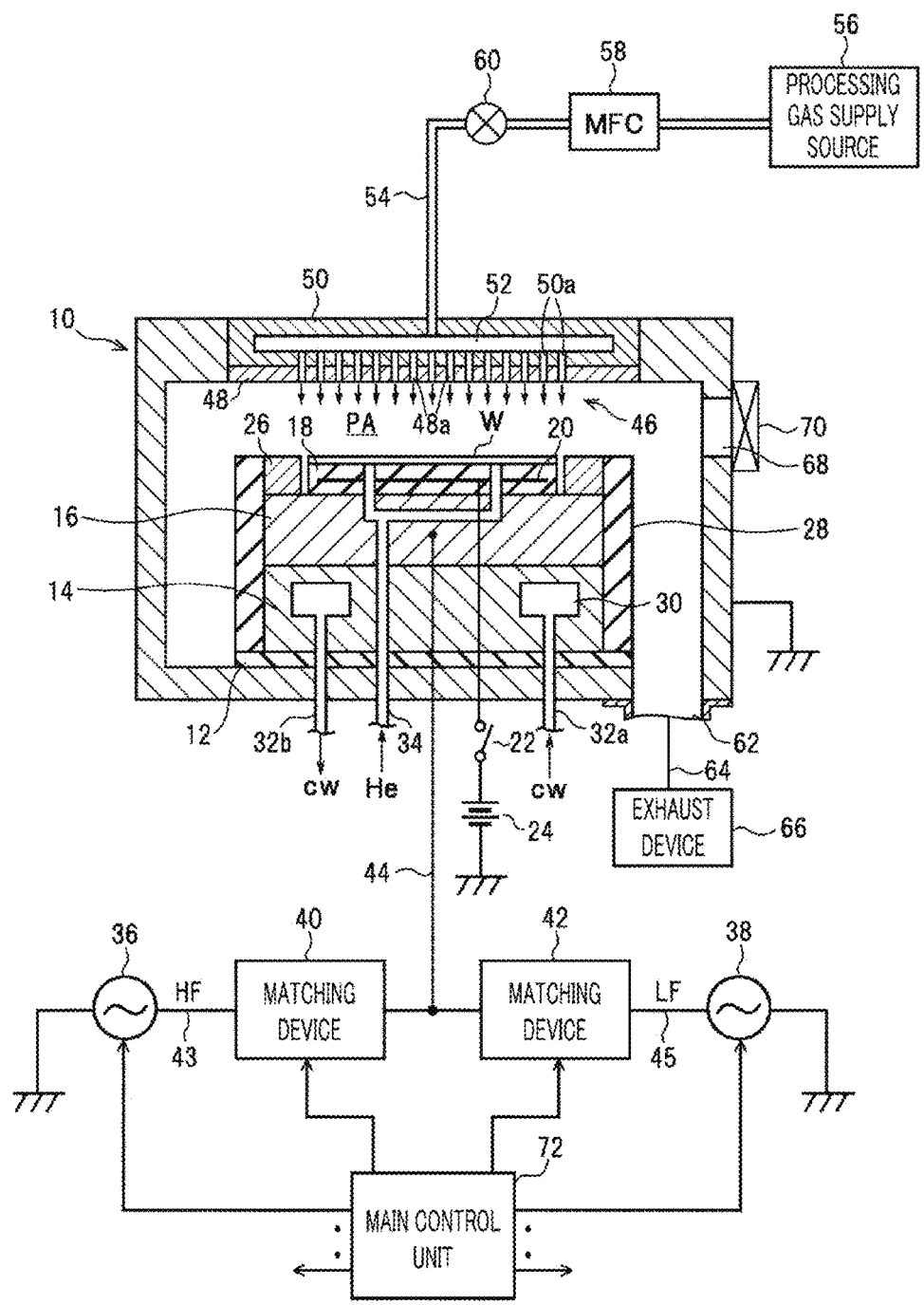
FIG. 1 is a cross sectional view illustrating a configuration of a capacitively coupled plasma processing apparatus in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

<Configuration of Plasma Processing Apparatus>

FIG. 1 shows a configuration of a plasma processing apparatus in accordance with an example embodiment. This plasma processing apparatus is configured as a capacitively coupled (parallel plate type) plasma etching apparatus in which dual high frequency powers are applied to a lower electrode. By way of example, the plasma processing apparatus includes a cylindrical decompression chamber (processing vessel) 10 made of, but not limited to, aluminum having an alumite-treated (anodically oxidized) surface. The chamber 10 is grounded.

A circular columnar susceptor supporting member 14 is provided on an insulating plate 12 such as ceramic on a bottom of the chamber 10, and a susceptor 16 made of, but not limited to, aluminum is provided on the susceptor supporting member 14. The susceptor 16 serves as a lower electrode, and a processing target object, e.g., a semiconductor wafer W is mounted on the susceptor 16.

An electrostatic chuck 18 configured to hold the semiconductor wafer W is provided on a top surface of the susceptor 16. The electrostatic chuck 18 includes a pair of insulating layers or insulating sheets; and an electrode 20 embedded therebetween. The electrode 20 is made of a conductive film and is electrically connected with a DC power supply 24 via a switch 22. The semiconductor wafer W can be held on the electrostatic chuck 18 by an electrostatic adsorptive force generated by a DC voltage applied from the DC power supply 24. In order to improve etching uniformity, a focus ring 26 made of, but not limited to, silicon is provided on the top surface of the susceptor 16 to surround the electrostatic chuck 18. A cylindrical inner wall member 28 made of, but not limited to, quartz is attached to side surfaces of the susceptor 16 and the susceptor supporting member 14.

A coolant path 30 extended in, e.g., a circumferential direction is provided within the susceptor supporting member 14. A coolant of a preset temperature, e.g., cooling water cw from an external chiller unit (not shown) is supplied into and circulated through the coolant path 30 via pipelines 32a and 32b. A processing temperature of the semiconductor wafer W on the susceptor 16 can be controlled by adjusting the temperature of the coolant. Further, a heat transfer gas, e.g., a He gas from a heat transfer gas supplying device (not shown) is supplied into a gap between a top surface of the electrostatic chuck 18 and a rear surface of the semiconductor wafer W through a gas supply line 34.

The susceptor 16 is electrically connected with high frequency power supplies 36 and 38 via matching devices 40 and 42, respectively, and a common power supply conductor (for example, a power supply rod) 44. One high frequency power supply 36 outputs a high frequency power HF having a frequency $f_{HF}$ (for example, 40 MHz) suitable for plasma generation. Meanwhile, the other high frequency power supply 38 outputs a high frequency power LF having a frequency $f_{LF}$ (for example, 12.88 MHz) suitable for ion attraction to the semiconductor wafer W on the susceptor 16 from the plasma.

As such, the matching device 40 and the power supply rod 44 constitute a part of a high frequency transmission line (high frequency transmission path) 43 configured to transmit the high frequency power HF for plasma generation from the high frequency power supply 36 to the susceptor 16. Meanwhile, the matching device 42 and the power supply rod 44 constitute a part of a high frequency transmission line (high frequency transmission path) 45 configured to transmit the high frequency power LF for ion attraction from the high frequency power supply 38 to the susceptor 16.

An upper electrode 46 having a ground potential is provided at a ceiling of the chamber 10, facing the susceptor 16 in parallel. The upper electrode 46 includes an electrode plate 48 which has a multiple number of gas discharge holes 48a and is made of, e.g., a silicon-containing material such as Si or SiC; and an electrode supporting body 50 which detachably supports the electrode plate 48 and is made of a conductive material such as aluminum having an alumite-treated surface. A plasma generation space or a processing space PA is formed between the upper electrode 46 and the susceptor 16.

The electrode supporting body 50 has a gas buffer room 52 formed therein. The electrode supporting body 50 also has, in its bottom surface, a multiple number of gas holes 50a extended from the gas buffer room 52, and the gas holes 50a communicate with the gas discharge holes 48a of the electrode plate 48, respectively. The gas buffer room 52 is connected to a processing gas supply source 56 via a gas supply line 54. The processing gas supply source 56 is provided with a mass flow controller (MFC) 58 and an opening/closing valve 60. If a certain processing gas (etching gas) is introduced into the gas buffer room 52 from the processing gas supply source 56, the processing gas is then discharged in a shower shape from the gas discharge holes 48a of the electrode plate 48 into the processing space PA toward the semiconductor wafer W on the susceptor 16. In this configuration, the upper electrode 46 also serves as a shower head that supplies the processing gas into the processing space PA.

Further, a passageway (not shown) in which a coolant, e.g., cooling water flows may be provided within the electrode supporting body 50. The entire upper electrode 46, especially, the electrode plate 48 is controlled to have a preset temperature through the coolant by an external chiller unit. Further, in order to stabilize the temperature control over the upper electrode 46, a heater (not shown) including a resistance heating device may be provided within or on a top surface of the electrode supporting body 50.

An annular space formed between a sidewall of the chamber 10, and the susceptor 16 and the susceptor supporting member 14 serves as a gas exhaust space, and a gas exhaust opening 62 of the chamber 10 is formed at a bottom of this gas exhaust space. The gas exhaust opening 62 is connected to a gas exhaust device 66 via a gas exhaust line 64. The gas exhaust device 66 includes a vacuum pump such as a turbo molecular pump and is configured to depressurize the inside of the chamber 10, particularly, the processing space PA to a required vacuum level. Further, a gate valve 70 configured to open and close a loading/unloading opening 68 for the semiconductor wafer W is provided at the sidewall of the chamber 10.

A main control unit 72 includes one or more microcomputers and is configured to control an overall operation (sequence) of the apparatus and individual operations of respective components within the apparatus, particularly, the high frequency power supplies 36 and 38, the matching devices 40 and 42, the MFC 58, the opening/closing valve 60, the gas exhaust device 66, etc., according to software (program) and recipes stored in an external memory or an internal memory.

Further, the main control unit 72 is connected to a man-machine interface manipulation panel (not shown) including an input device such as a keyboard and a display device such as a liquid crystal display and, also, connected to an external storage device (not shown) that stores various types of data such as various programs or recipes, setting values, etc. In the present example embodiment, the main control unit 72 is configured as a single control unit. However, it may be also possible to adopt a configuration in which multiple control units divide up the functions of the main control unit 72 individually or hierarchically. Especially, a part of the functions of the main control unit 72 may be included in the matching devices 40 and 42.

A basic operation of single-sheet typed dry etching in the capacitively coupled plasma etching apparatus configured as described above is performed as follows. First, the gate valve 70 is opened, and a semiconductor wafer W to be processed is loaded into the chamber 10 and mounted on the electrostatic chuck 18. Then, a processing gas, i.e., an etching gas (generally, a gaseous mixture) is introduced into the chamber 10 from the processing gas supply source 56 at a preset flow rate and a preset flow rate ratio, and the inside of the chamber 10 is evacuated to be a set vacuum pressure by the gas exhaust device 66. Further, the high frequency power HF (40 MHz) for plasma generation and the high frequency power LF (12.88 MHz) for ion attraction from the high frequency power supplies 36 and 38 are overlapped at preset powers, respectively, to be applied to the susceptor 16. Further, a DC voltage from the DC power supply 24 is applied to the electrode 20 of the electrostatic chuck 18, so that the semiconductor wafer W is held on the electrostatic chuck 18. The etching gas discharged from the upper electrode 46 serving as the shower head is electrically discharged under a high frequency electric field between the two electrodes 46 and 16, so that plasma is generated in the processing space PA. An etching target film on a main surface of the semiconductor wafer W is etched by radicals or ions included in the plasma.

In this plasma etching apparatus, for example, to solve the above-described problem of charging damage, a first power modulation method of pulse-modulating a high frequency power HF for plasma generation outputted from the high frequency power supply 36 with a modulation pulse MS having a regular frequency $f_S$ selected within a range of, for example, 1 kHz to 100 kHz and a variable duty ratio $D_S$ can be performed on the etching process.

Figure 2A:
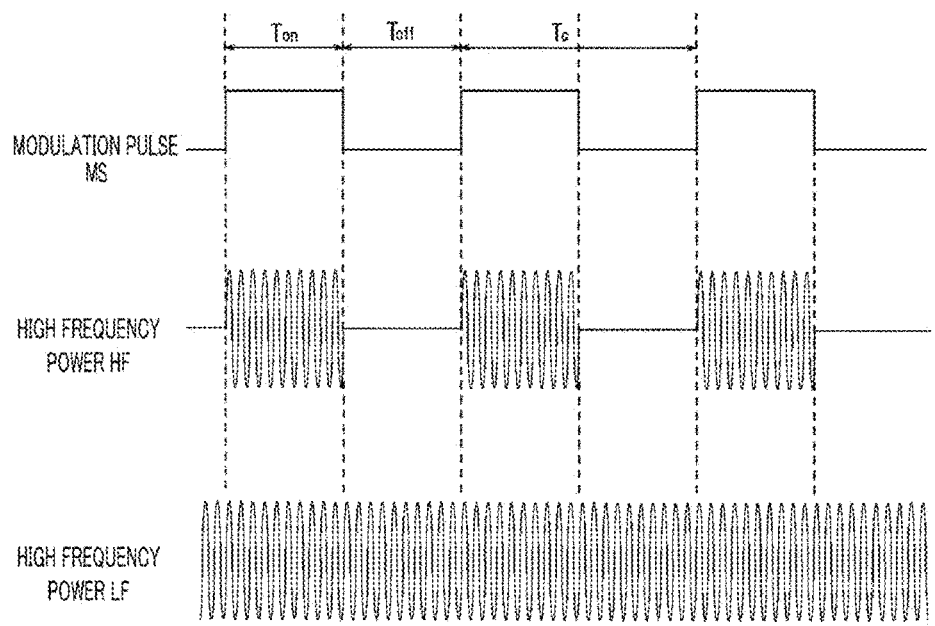
FIG. 2A are diagrams showing waveforms of respective components for describing a first power modulation method.

In this case, the main control unit 72 sends a control signal instructing the power modulation as a RF output mode to the high frequency power supply 36 for the plasma generation system and applies thereto the modulation pulse MS defining the frequency $f_S$ and the duty ratio $D_S$ for the power modulation. The high frequency power supply 36 turns on and off the high frequency power HF in synchronization with the modulation pulse MS, as depicted in FIG. 2A. Here, assuming that a cycle, an on-period (first period) and an off-period (second period) of the modulation pulse MS are set to $T_{C1}$, $T_{on}$, and $T_{off}$, respectively, relational expressions of $T_C=1/f_S$, $T_C=T_{on}+T_{off}$, and $D_S=T_{on}/(T_{on}+T_{off})$ are established.

Meanwhile, when using the first power modulation method, the main control unit 72 instructs the high frequency power supply 38 for ion attraction to output a continuous wave as a RF output mode and applies the same pulse as the modulation pulse MS or a timing signal in synchronization with the pulse to the high frequency power supply 38 along with a control signal or set value data.

Further, in this plasma etching apparatus, to solve the above-described problem of micro-loading effect, a second power modulation method of pulse-modulating a high frequency power LF for ion attraction outputted from the high frequency power supply 38 with a modulation pulse MS having a regular frequency $f_S$ selected within a range of, for example, 100 Hz to 50 kHz and a variable duty ratio $D_S$ may also be performed on the etching process.

Figure 2B:
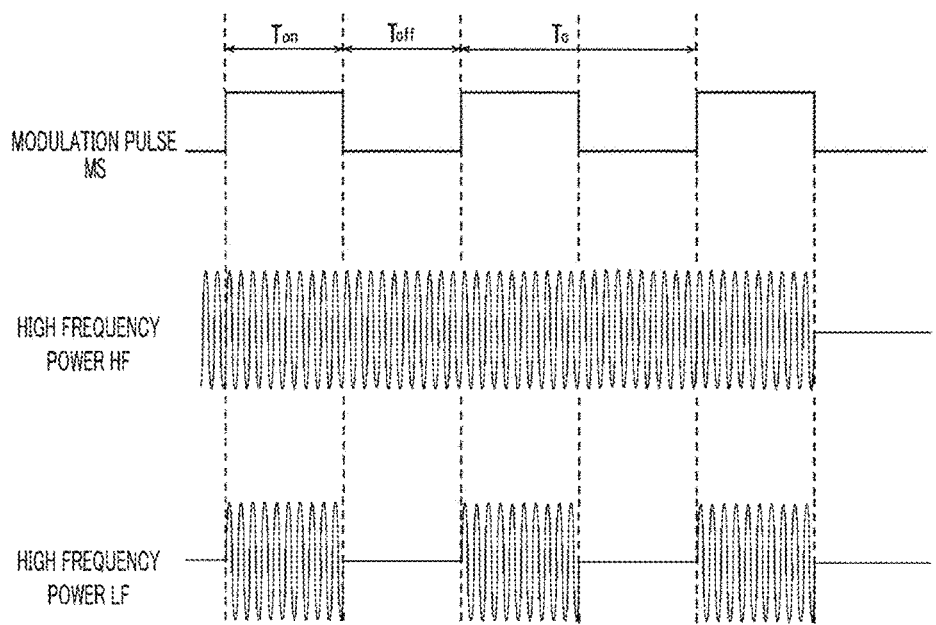
FIG. 2B are diagrams showing waveforms of respective components for describing a second power modulation method.

In this case, the main control unit 72 sends a control signal instructing the power modulation as a RF output mode to the high frequency power supply 38 for ion attraction and applies thereto the modulation pulse MS defining the frequency $f_S$ and the duty ratio $D_S$ for the power modulation. The high frequency power supply 38 turns on and off the high frequency power LF for ion attraction in synchronization with the modulation pulse MS, as depicted in FIG. 2B. Here, assuming that a cycle, an on-period (first period) and an off-period (second period) of the modulation pulse MS are set to $T_C$, $T_{on}$, and $T_{off}$, respectively, relational expressions of $T_C=1/f_S$, $T_C=T_{on}+T_{off}$, and $D_S=T_{on}/(T_{on}+T_{off})$ are established.

Meanwhile, when using the second power modulation method, the main control unit 72 instructs the high frequency power supply 36 for plasma generation to output a continuous wave as a RF output mode and applies the same pulse as the modulation pulse MS or a timing signal in synchronization with the pulse to the high frequency power supply 36 along with a control signal or set value data.

<Configuration of High Frequency Power Supply and Matching Device for Plasma Generation System>

Figure 3:
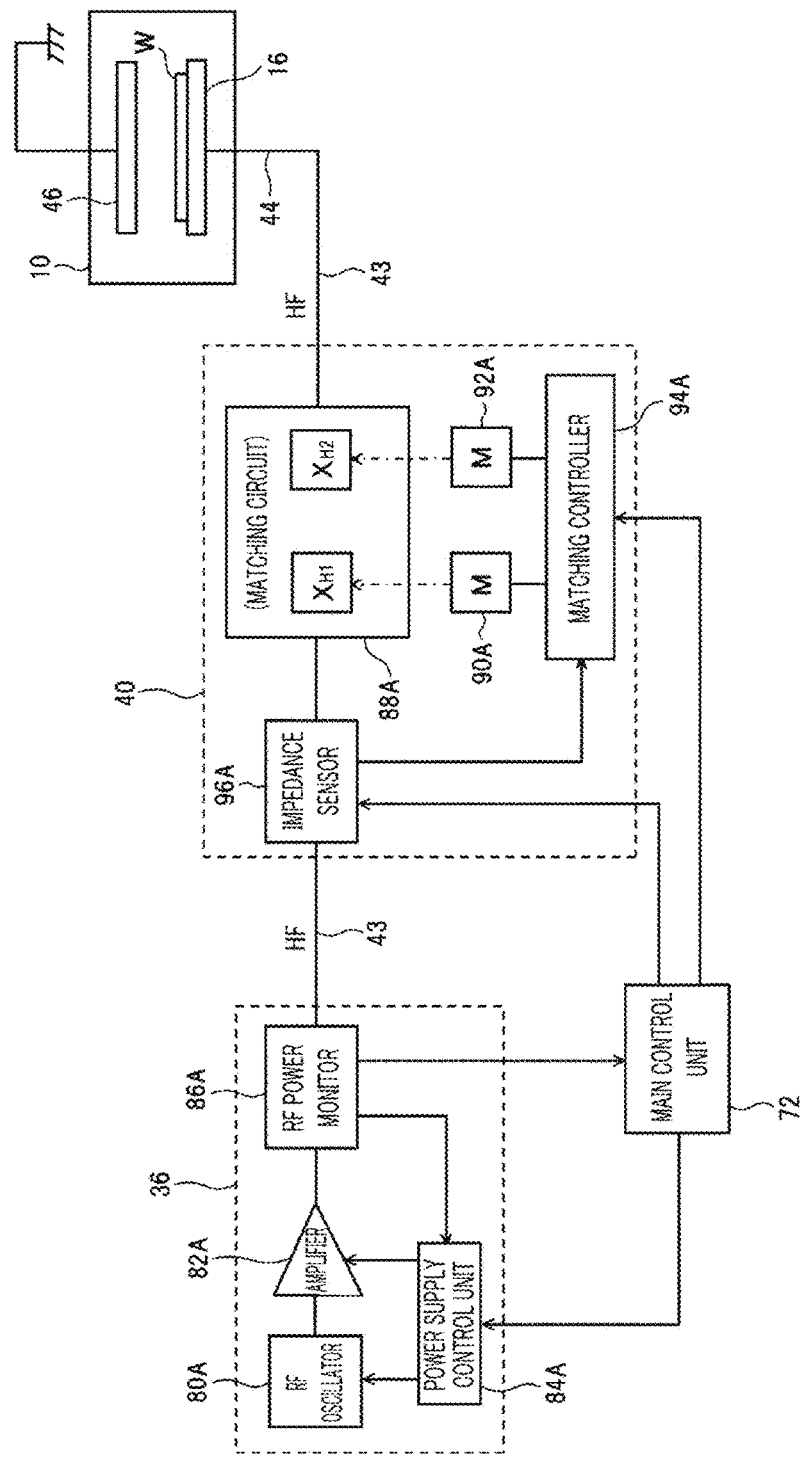
FIG. 3 is a block diagram illustrating a configuration of a matching device and a high frequency power supply for plasma generation.

FIG. 3 illustrates a configuration of the high frequency power supply 36 and a matching device 40 of the plasma generation system.

The high frequency power supply 36 includes a RF oscillator 80A configured to generate a fundamental high frequency sine wave of a regular frequency (for example, 40 MHz) suitable for plasma generation; a power amplifier 82A configured to amplify a power of the fundamental high frequency sine wave outputted from the RF oscillator 80A with a controllable gain or amplification factor; and a power supply control unit 84A configured to directly control the RF oscillator 80A and the power amplifier 82A in response to a control signal from the main control unit 72. The main control unit 72 sends, to the power supply control unit 84A, not only the control signal for instructing the RF output mode and the modulation pulse MS, but also control signals regarding typical power on/off or power interlock relation and data such as power set values. When the first power modulation method (FIG. 2A) is performed in this plasma processing apparatus, the power supply control unit 84A constitutes a power modulation unit under the control of the main control unit 72.

The high frequency power supply 36 also includes a RF power monitor 86A. The RF power monitor 86A includes a directional coupler, a progressive wave power monitoring unit, and a reflection wave power monitoring unit (which are not illustrated). Herein, the directional coupler extracts signals corresponding to a power of a progressive wave propagating on the high frequency transmission line 43 in a forward direction and a power of a reflection wave propagating on the high frequency transmission line 43 in a backward direction. The progressive wave power monitoring unit is configured to output a progressive wave power measurement signal indicating the power of the progressive wave included in the progressive wave propagating on the high frequency transmission line 43 based on the progressive wave power detection signal extracted by the directional coupler. This progressive wave power measurement signal is sent to the power supply control unit 84A within the high frequency power supply 36 for power feedback control and also sent to the main control unit 72 for monitor display. The reflection wave power monitoring unit is configured to measure a power of a reflection wave returning back to the high frequency power supply 36 from plasma within the chamber 10. The reflection wave power measurement value outputted from the reflection wave power monitoring unit is sent to the main control unit 72 for monitor display and also sent to the power supply control unit 84A within the high frequency power supply 36 as a monitor value for protecting the power amplifier.

The matching device 40 includes a matching circuit 88A including multiple, for example, two controllable reactance elements (for example, variable capacitors or variable inductors) $X_{H1}$ and $X_{H2}$ connected to the high frequency transmission line 43; a matching controller 94A configured to control reactances of the reactance elements $X_{H1}$ and $X_{H2}$ via actuators such as motors (M) 90A and 92A; and an impedance sensor 96A configured to measure load impedance including impedance of the matching circuit 88A on the high frequency transmission line 43. An internal configuration and an operation of the impedance sensor 96A will be described in detail later.

<Configuration of High Frequency Power Supply and Matching Device for Ion Attraction System>

Figure 4:
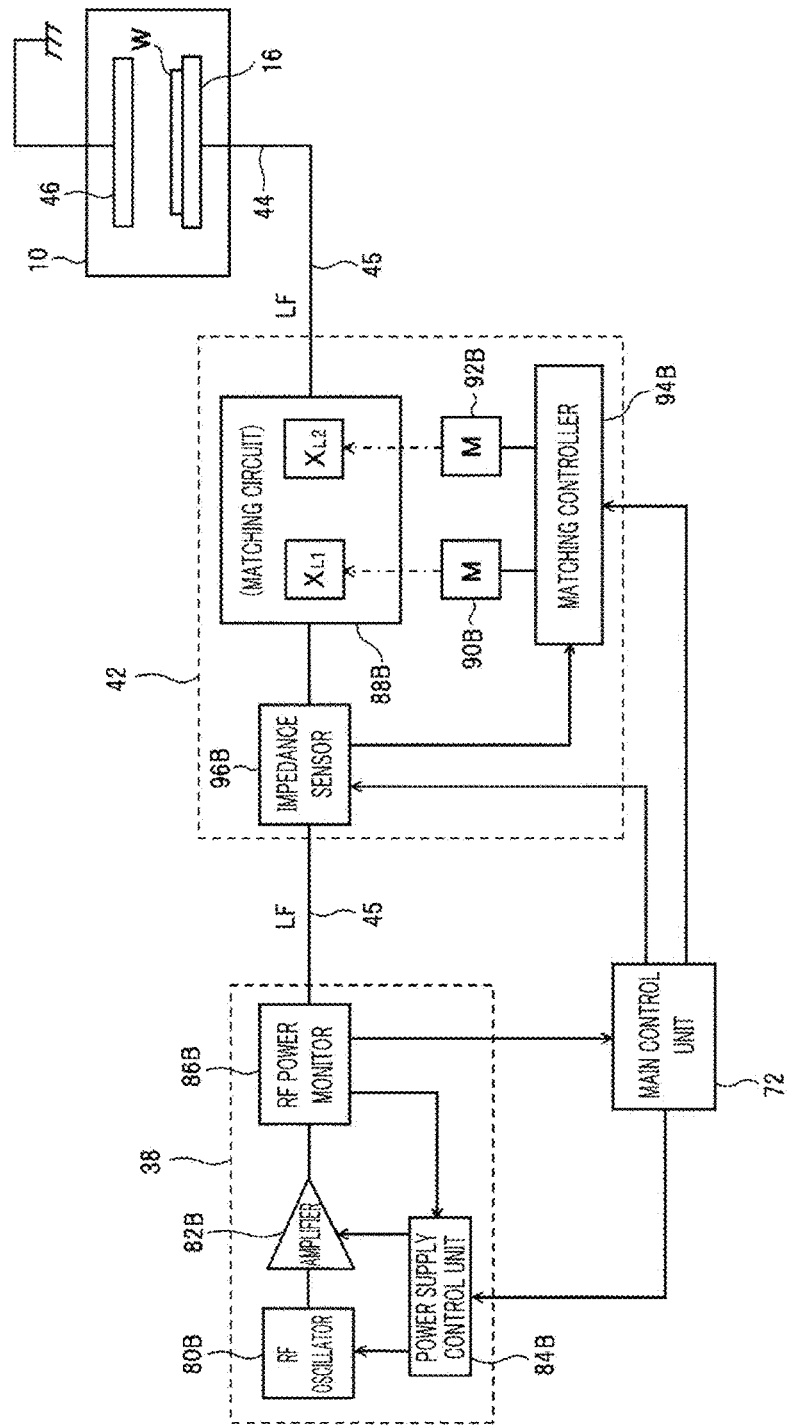
FIG. 4 is a block diagram illustrating a configuration of a matching device and a high frequency power supply for ion attraction.

FIG. 4 illustrates a configuration of the high frequency power supply 38 for ion attraction and the matching device 42 in accordance with the example embodiment.

The high frequency power supply 38 includes a RF oscillator 80B configured to generate a fundamental high frequency sine wave of a regular frequency (for example, 12.88 MHz) suitable for ion attraction; a power amplifier 82B configured to amplify a power of the fundamental high frequency sine wave outputted from the RF oscillator 80B with a controllable gain or amplification factor; and a power supply control unit 84B configured to directly control the RF oscillator 80B and the power amplifier 82B in response to a control signal from the main control unit 72; and a RF power monitor 86B. The components 80B to 86B within the high frequency power supply 38 respectively have the same configurations and the same functions as the components 80A to 86A within the high frequency power supply 36 except that the frequency (12.88 MHz) of the RF oscillator 80B is different from the frequency (40 MHz) of the RF oscillator 80A. When the second power modulation method (FIG. 2B) is performed in this plasma processing apparatus, the power supply control unit 84B constitutes a power modulation unit under the control of the main control unit 72.

The matching device 42 includes a matching circuit 88B including multiple, for example, two controllable reactance elements (for example, variable capacitors or variable inductors) $X_{L1}$ and $X_{L2}$; a matching controller 94B configured to control reactances of the reactance elements $X_{L1}$ and $X_{L2}$ via actuators, for example, motors (M) 90B and 92B; and an impedance sensor 96B configured to measure load impedance including impedance of the matching circuit 88B on the high frequency transmission line 45.

<Configuration of Impedance Sensor>

Figure 5:
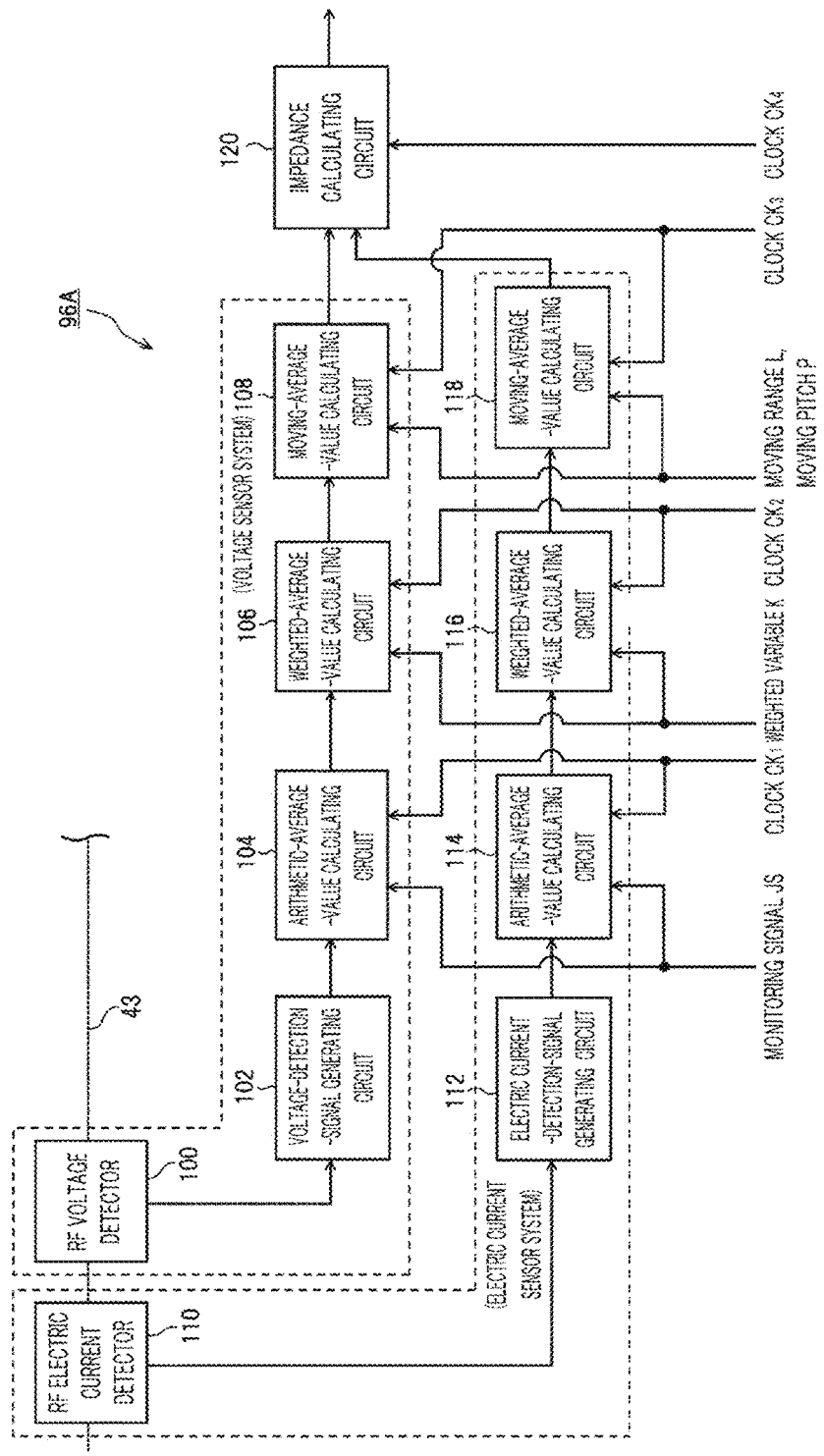
FIG. 5 is a block diagram illustrating a configuration of an impedance sensor provided in the matching device of a plasma generation system (first experimental example)

FIG. 5 depicts a configuration of the impedance sensor 96A provided within the matching device 40 of the plasma generation system. This impedance sensor 96A includes a RF voltage detector 100; a voltage-detection-signal generating circuit 102; an arithmetic-average-value calculating circuit 104, a weighted-average-value calculating circuit 106 and a moving-average-value calculating unit 108 of a voltage sensor system. Further, the impedance sensor 96A includes a RF electric current detector 110; an electric current-detection-signal generating circuit 112; an arithmetic-average-value calculating circuit 114, a weighted-average-value calculating circuit 116 and a moving-average-value calculating unit 118; and an impedance calculating circuit 120 of an electric current sensor system.

In the voltage sensor system, the RF voltage detector 100 is configured to detect a voltage of the high frequency power HF on the high frequency transmission line 43. The voltage-detection-signal generating circuit 102 includes, for example, a superheterodyne filter circuit, and is configured to generate a voltage detection signal V corresponding to the voltage of the high frequency power HF through analogue filtering of an output signal of the RF voltage detector 100.

In the second power modulation method, i.e., when the high frequency power HF for plasma generation is the continuous wave, in each cycle of the modulation pulse MS, the arithmetic-average-value calculating circuit 104 samples voltage detection signals V from the voltage-detection-signal generating circuit 102 with a preset sampling frequency $f_C$ during the pulse-on period $T_{on}$, and calculates an arithmetic average value $aV_{on}$ of the voltage detection signals V during the pulse-on period $T_{on}$. Further, the arithmetic-average-value calculating circuit 104 samples voltage detection signals V from the voltage-detection signal generating circuit 102 with the preset sampling frequency $f_C$ during the pulse-off period $T_{off}$, and calculates an arithmetic average value $aV_{off}$ of the voltage detection signals V during the pulse-off period $T_{off}$.

Meanwhile, in the first power modulation method, i.e., when the high frequency power HF is in the pulse shape, in each cycle of the modulation pulse MS, the arithmetic-average-value calculating circuit 104 samples voltage detection signals V from the voltage-detection-signal generating circuit 102 only during the pulse-on period $T_{on}$ and calculates an arithmetic average value $aV_{on}$ of the voltage detection signals V during the pulse-on period $T_{on}$.

The main control unit 72 (FIG. 1) sends a monitoring signal JS indicating a sampling time or a monitoring time in synchronization with the modulation pulse MS and a sampling clock $CK_1$ to the arithmetic-average-value calculating circuit 104. Here, as for the monitoring signal JS, the monitoring times $T_1$ and $T_2$ are set for both of the pulse-on period $T_{on}$ and the pulse-off period $T_{off}$, respectively, in the second power modulation method, whereas a monitoring time $T_1$ is set only for the pulse-on period $T_{on}$ in the first power modulation method. The arithmetic-average-value calculating circuit 104 is required to process large quantity of signals at a high speed in synchronization with the sampling clock $CK_1$ of several tens of MHz, and, thus, a FPGA (field programmable gate array) can be used appropriately.

The weighted-average-value calculating circuit 106 is appropriately composed of a CPU and is operated when the high frequency power HF for plasma generation is the continuous wave under the second power modulation method. The weighted-average-value calculating circuit 106 weighted-averages the arithmetic average value $aV_{on}$ of the voltage detection signals V during the pulse-on period $T_{on}$ and the arithmetic average value $aV_{off}$ of the voltage detection signals V during the pulse-off period $T_{off}$ obtained from the arithmetic-average-value calculating circuit 104 with a preset weighted value (weighted variable K), and thus calculates a weighted average value bV of the voltage detection signals V for the single cycle. The main control unit 72 sends a clock $CK_2$ and the weighted variable K for the weighted averaging to the weighted-average-value calculating circuit 106.

If, however, the high frequency power HF is in the pulse shape under the first power modulation method, the weighted-average-value calculating circuit 106 is not operated, and the arithmetic average value $aV_{on}$ of the voltage detection signals V during the pulse-on period $T_{on}$ outputted from the arithmetic-average-value calculating circuit 104 is sent to the moving-average-value calculating circuit 108 at the rear end of the weighted-average-value calculating circuit 106 without passing through the weighted-average-value calculating circuit 106.

The moving-average-value calculating circuit 108 is appropriately composed of a CPU. In the second power modulation method, i.e., when the high frequency power HF for plasma generation is the continuous wave, a moving weighted average value cV of the voltage detection signals V is calculated based on the multiple consecutive weighted average values bV of the voltage detection signals V for the single cycle obtained from the weighted-average-value calculating circuit 106.

In the first power modulation method, i.e., when the high frequency power HF is in the pulse shape, the moving-average-value calculating circuit 108 calculates a moving average value dV of voltage detection signals V based on the multiple consecutive arithmetic average values $aV_{on}$ of the voltage detection signals V during the pulse-on period $T_{on}$ outputted from the arithmetic-average-value calculating circuit 104. The main control unit 72 sends a clock $CK_3$ and set values of a moving range L and a moving pitch P to the moving-average-value calculating circuit 108.

In the electric current sensor system, the RF electric current detector 110 is configured to detect an electric current of the high frequency power HF on the high frequency transmission line 43. The electric current-detection-signal generating circuit 112 includes, for example, a superheterodyne filter circuit, and is configured to generate an electric current detection signal I corresponding to the electric current of the high frequency power HF through analogue filtering of a high frequency electric current detection signal outputted from the RF electric current detector 110.

In the second power modulation method, i.e., when the high frequency power HF for plasma generation is the continuous wave, in each cycle of the modulation pulse MS, the arithmetic-average-value calculating circuit 114 samples electric current detection signals I from the electric current-detection-signal generating circuit 112 with the sampling frequency $f_C$ during the pulse-on period $T_{on}$, and calculates an arithmetic average value $aI_{on}$ of the electric current detection signals I during the pulse-on period $T_{on}$. Further, the arithmetic-average-value calculating circuit 114 samples electric current detection signals I from the electric current-detection signal generating circuit 112 with the sampling frequency $f_C$ during the pulse-off period $T_{off}$, and calculates an arithmetic average value $aI_{off}$ of the electric current detection signals I during the pulse-off period $T_{off}$.

Meanwhile, in the first power modulation method, i.e., when the high frequency power HF is with the pulse, in each cycle of the modulation pulse MS, the arithmetic-average-value calculating circuit 114 samples the electric current detection signals I from the electric current-detection-signal generating circuit 112 with the sampling frequency $f_C$ only during the pulse-on period $T_{on}$, and calculates an arithmetic average value $aI_{on}$ of the electric current detection signals I during the pulse-on period $T_{on}$. The main control unit 72 sends the same monitoring signal JS and clock $CK_1$ as those sent to the arithmetic-average-value calculating circuit 104 of the voltage sensor system to the arithmetic-average-value calculating circuit 114.

The weighted-average-value calculating circuit 116 is appropriately composed of a CPU and is operated when the high frequency power HF for plasma generation is the continuous wave under the second power modulation method. The weighted-average-value calculating circuit 116 weighted-averages the arithmetic average value $aI_{on}$ of the electric current detection signals I during the pulse-on period $T_{on}$ and the arithmetic average value $aI_{off}$ of the electric current detection signals I during the pulse-off-period $T_{off}$ obtained from the arithmetic-average-value calculating circuit 114 with the preset weighted value (weighted variable K), and thus calculates a weighted average value bI of the electric current detection signals I for the single cycle. The main control unit 72 sends the same clock $CK_2$ and weighted variable K as those sent to the weighted-average-value calculating circuit 106 of the voltage sensor system to the weighted-average-value calculating circuit 116.

If, however, the high frequency power HF is in the pulse shape under the first power modulation method, the weighted-average-value calculating circuit 116 is not operated, and the arithmetic average value $aI_{on}$ of the electric current detection signals I during the pulse-on period $T_{on}$ outputted from the arithmetic-average-value calculating circuit 114 is sent to the moving-average-value calculating circuit 118 at the rear end of the weighted-average-value calculating circuit 116 without passing through the weighted-average-value calculating circuit 116.

The moving-average-value calculating circuit 118 is appropriately composed of a CPU. In the second power modulation method, i.e., when the high frequency power HF for plasma generation is the continuous wave, a moving weighted average value cI of the electric current detection signals I is calculated based on the multiple consecutive weighted average values bI of the electric current detection signals I for the single cycle obtained from the weighted-average-value calculating circuit 116.

In the first power modulation method, i.e., when the high frequency power HF is in the pulse shape, the moving-average-value calculating circuit 118 calculates a moving average value dI of the electric current detection signals I based on the multiple consecutive arithmetic average values $aI_{on}$ of the electric current detection signals I during the pulse-on period $T_{on}$ outputted from the arithmetic-average-value calculating circuit 114. The main control unit 72 sends the same clock $CK_3$ and set values of the moving range L and the moving pitch P as those sent to the moving-average-value calculating circuit 108 of the voltage sensor system to the moving-average-value calculating circuit 118.

When the high frequency power HF for plasma generation is the continuous wave under the second power modulation method, the impedance calculating circuit 120 calculates a measurement value MZ of a load impedance Z on the high frequency transmission line 43 with respect to the high frequency power supply 36 by diving the moving weighted average value cV of the voltage detection signals V obtained from the moving-average-value calculating circuit 108 of the voltage sensor system by the moving weighted average value cI of the electric current detection signals I obtained from the moving-average-value calculating circuit 118 of the electric current sensor system.

If, however, the high frequency power HF is in the pulse shape under the first power modulation method, the impedance calculating circuit 120 calculates the measurement value MZ of the load impedance Z on the high frequency transmission line 43 with respect to the high frequency power supply 36 by dividing the moving average value dV of the voltage detection signals V obtained from the moving-average-value calculating circuit 108 of the voltage sensor system by the moving average value dI of the electric current detection signals I obtained from the moving-average-value calculating circuit 118 of the electric current sensor system.

The load impedance measurement value MZ outputted from the impedance calculating circuit 120 is updated in synchronization with a preset clock $CK_4$ sent from the main control unit 72. Typically, the load impedance measurement value MZ includes an absolute value and a phase measurement value of the load impedance Z.

The impedance sensor 96B included in the matching device 42 of the ion attraction system has the same configuration and function as those of the above-described impedance sensor 96A except that the operation mode of the respective components in the first power modulation method and the operation mode of the respective components in the second power modulation method are reversed from each other.

<Operation of Matching Device>

Now, operations of the matching devices 40 and 42 in the present example embodiment will be discussed. As an example, the second power modulation method is performed on a plasma process in this plasma processing apparatus.

In this case, the main control unit 72 sends a control signal instructing the power modulation as a RF output mode or data such as power set values to the power supply control unit 84B of the high frequency power supply 38 of the ion attraction system, and also applies thereto a modulation pulse MS as a timing signal for the power modulation. Further, the main control unit 72 sends the monitoring signal JS, the set values L and P for moving average calculation and the clocks $CK_1$, $CK_2$, $CK_3$ and $CK_4$ according to the second power modulation method to the impedance sensor 96B of the matching device 42. In this case, the weighted variable K is not sent to the impedance sensor 96B.

Meanwhile, the main control unit 72 sends a control signal indicating the continuous wave as a RF output mode or data such as power set values to the power supply control unit 84A of the high frequency power supply 36 of the plasma generation system. Further, the main control unit 72 also sends the monitoring signal JS, the weighted variable K, the set values L and P for weighted average calculation and the clocks $CK_1$, $CK_2$, $CK_3$ and $CK_4$ according to the second power modulation method to the impedance sensor 96A of the matching device 40.

Figure 6B:
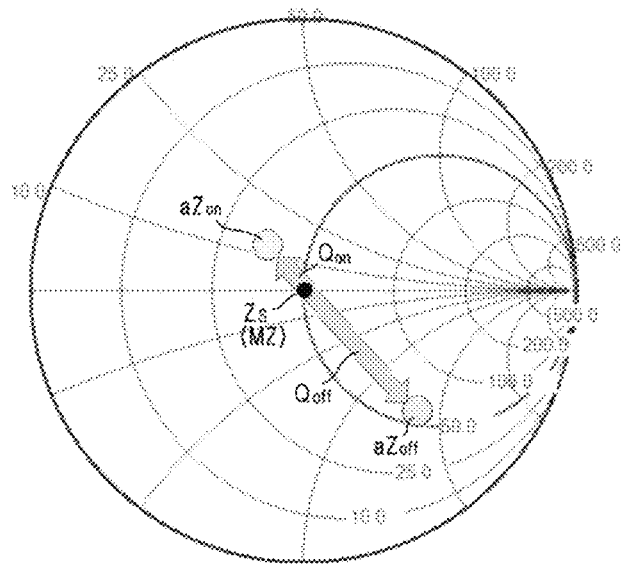
FIG. 6B is a Smith cart for describing the matching operation when the weighted variable k for weighted averaging is selected within a range of 0.5<K≤1.

In the impedance sensor 96A of the matching device 40, as depicted in FIG. 6A, the monitoring times $T_1$ and $T_2$ are set within the pulse-on period $T_{on}$ and the pulse-off period $T_{off}$ in each cycle of the modulation pulse MS, respectively. Desirably, within the pulse-on period $T_{on}$, the monitoring time $T_1$ is set within a time range excluding transient times immediately after the starting of the pulse-on period $T_{on}$ and immediately before the ending thereof, i.e., when the reflection wave power on the high frequency transmission line 43 is rapidly changed. Likewise, within the pulse-off period $T_{off}$, the monitoring time $T_2$ is set within a time range excluding the transient times immediately after the starting of the pulse-off period $T_{off}$ and immediately before the ending thereof.

Also, in each cycle of the modulation pulse MS, the arithmetic-average-value calculating circuit 104 of the voltage sensor system samples the voltage detection signals V outputted from the voltage-detection-signal generating circuit 102 with the preset sampling frequency $f_C$ during the pulse-on period $T_{on}$ and calculates an arithmetic average value $aV_{on}$ of the voltage detection signals V during the pulse-on period $T_{on}$. Further, the arithmetic-average-value calculating circuit 104 samples the voltage detection signals V outputted from the voltage-detection-signal generating circuit 102 with the preset sampling frequency $f_C$ during the pulse-off period $T_{off}$ and calculates the arithmetic average value $aV_{off}$ of the voltage detection signals V during the pulse-off period $T_{off}$.

In each cycle of the modulation pulse MS, the arithmetic-average-value calculating circuit 114 of the electric current sensor system samples the electric current detection signals I outputted from the electric current-detection-signal generating circuit 112 with the preset sampling frequency $f_C$ during the pulse-on period $T_{on}$ and calculates the arithmetic average value $aI_{on}$ of the electric current detection signals I during the pulse-on period $T_{on}$. Also, the arithmetic-average-value calculating circuit 114 samples the electric current detection signals I outputted from the electric current-detection-signal generating circuit 112 with the preset sampling frequency $f_C$ during the pulse-off period $T_{off}$ and calculates the arithmetic average value $aI_{off}$ of the electric current detection signals I during the pulse-off period $T_{off}$.

Accordingly, in each cycle of the modulation pulse MS, the arithmetic-average-value calculating circuit 104 of the voltage sensor system and the arithmetic-average-value calculating circuit 114 of the electric current sensor system substantially sample the values of the load impedance Z on the high frequency transmission line 43 with a cycle of the clock $CK_1$ during the pulse-on period $T_{on}$ and calculates an arithmetic average value $aZ_{on}$ of the load impedance Z during the pulse-on period $T_{on}$, and, also, sample the values of the load impedance Z on the high frequency transmission line 43 with a cycle of the clock $CK_1$ during the pulse-off period $T_{off}$ and calculates an arithmetic average value $aZ_{off}$ of the load impedance Z during pulse-off period $T_{off}$. Here, the arithmetic average values $aZ_{on}$ and $aZ_{off}$ are represented by the following equations (1) and (2).

$$aZ_{on}=aV_{on}/aI_{on} \quad (1)$$

$$aZ_{off}=aV_{off}/aI_{off} \quad (2)$$

The weighted-average-value calculating circuit 106 of the voltage sensor system calculates a weighted average value bV of the voltage detection signals V for the single cycle by weighted-averaging the arithmetic average value $aV_{on}$ of the voltage detection singles V during the pulse-on period $T_{on}$ and the arithmetic average value $aV_{off}$ of the voltage detection signals V during the pulse-off period $T_{off}$ obtained from the arithmetic-average-value calculating circuit 104 with the preset weighted value (weighted variable K). Here, the weighted variable K is selected within a range of 0≤K≤1, and the weighted average value bV is represented by the following equation (3).

$$bV=K*aV_{on}+(1-K)*aV_{off} \quad (3)$$

The weighted-average-value calculating circuit 116 of the electric current sensor system calculates a weighted average value bI of the electric current detection signals I for the single cycle by weighted-averaging the arithmetic average value $aI_{on}$ of the electric current detection singles I during the pulse-on period $T_{on}$ and the arithmetic average value $aV_{off}$ of the electric current detection signals I during the pulse-off period $T_{off}$ obtained from the arithmetic-average-value calculating circuit 114 with the preset weighted value (weighted variable K). Here, the weighted average value bI is represented by the following equation (4).

$$bI=K*aI_{on}+(1-K)*aI_{off} \quad (4)$$

Accordingly, the weighted-average-value calculating circuit 106 of the voltage sensor system and the weighted-average-value calculating circuit 116 of the electric current sensor system substantially calculate a weighted average value bZ of the load impedance Z for the single cycle by the weighted-averaging the arithmetic average value $aZ_{on}$ of the load impedance Z during the pulse-on period $T_{on}$ and the arithmetic average value $aZ_{off}$ of the load impedance Z during the pulse-off period $T_{off}$. Here, the weighted average value bZ is represented by the following equation (5).

$$bZ=K*aZ_{on}+(1\times K)*aZ_{off} \quad (5)$$

The moving-average-value calculating circuit 108 of the voltage sensor system calculates a moving weighted average value cV of the voltage detection signals V with a preset moving range L and a preset moving pitch P based on the multiple (n number of) consecutive weighted average values bV of voltage detection signals V for the single cycle outputted from the weighted-average-value calculating circuit 106. By way of example, when the frequency $f_S$ of the modulation pulse MS is 100 Hz, if the moving range L and the moving pitch P are set to be 100 msec and 20 msec, respectively, one moving average value cV is calculated for 10 consecutive weighted average values bV for the single cycle every 20 msec.

The moving-average-value calculating circuit 118 of the electric current sensor system calculates a moving weighted average value cI of the electric current detection signals I with the preset moving range L and the preset moving pitch P based on the multiple (n number of) consecutive weighted average values bI of the electric detection signals I for the single cycle outputted from the weighted-average-value calculating circuit 116. Likewise in the moving-average-value calculating circuit 108 of the voltage sensor system, assuming that the frequency $f_S$ of the modulation pulse MS is 100 Hz, the moving range L is set to 100 msec and the moving pitch P is set to 20 msec, one moving average value cI is calculated for 10 consecutive weighted average values bI for the single cycle every 20 msec. Further, a relationship of $P=1/f_{CK3}$ is established between the moving pitch P and a frequency $f_{CK3}$ of the clock $CK_3$.

Accordingly, the moving-average-value calculating circuit 108 of the voltage sensor system and the moving-average-value calculating circuit 118 of the electric current sensor system substantially calculate a moving weighted average value cZ of the load impedance Z with the preset moving range L and the preset moving pitch P based on the multiple (n number of) consecutive weighted average values bZ of the load impedance Z for the single cycle obtained from the weighted-average-value calculating circuits 106 and 116. Here, the moving weighted average value cZ of the load impedance Z is represented by the following equation (6).

$$cZ=cV/cI \qquad (6)$$

The impedance calculating circuit 120 actually operates the above equation (6). That is, the impedance calculating circuit 120 divides the moving weighted average value cV of the voltage detection signals V outputted from the moving-average-value calculating circuit 108 of the voltage sensor system by the moving weighted average value cI of the electric current detection signals I outputted from the moving-average-value calculating circuit 118 of the electric current sensor system (i.e., performs an operation of cZ=cV/cI) for each cycle of the clock $CK_4$ same as the clock $CK_3$ or the moving pitch P. Then, the impedance calculating circuit 120 outputs this calculated value, i.e., the moving weighted average value cZ of the load impedance Z as a load impedance measurement value MZ. The load impedance measurement value MZ depends on the value of the weighted variable K applied to the weighted-average-value calculating circuits 106 and 116 from the main control unit 72 and does not depend on a duty ratio $D_S$ of the modulation pulse MS.

The matching controller 94A within the matching device 40 follows up and responds to the load impedance measurement value MZ outputted from the impedance calculating circuit 120 within the impedance sensor 96A with the cycle of the clock $CK_4$, and controls the motors 90B and 92B to adjust reactances of the reactance elements $X_{L1}$ and $X_{L2}$ within the matching circuit 88B such that a phase of the load impedance measurement value MZ is zero (0) and an absolute value thereof is 50Ω, i.e., such that the load impedance measurement value MZ is equal to or approximate to a matching point $Z_S$.

As stated above, the matching device 40 performs a matching operation such that the load impedance measurement value MZ outputted from the impedance sensor 96A is equal to or approximate to the matching point $Z_S$. That is, the load impedance measurement value MZ is a matching target point. Accordingly, the arithmetic average value $aZ_{on}$ of the load impedance Z during the pulse-on period $T_{on}$ and the arithmetic average value $aZ_{off}$ of the load impedance Z during the pulse-off period $T_{off}$ are offset from the matching point $Z_S$ by a ratio of (1−K):K depending on the value of the weighted variable K for the weighted averaging.

That is, when 0.5<K≤1, the weighted value K for $aZ_{on}$ of the first term on the right side of the equation (5) for the weighted averaging is larger than the weighted value (1−K) for $aZ_{off}$ of the second term of the equation (5). Accordingly, as depicted in a Smith chart of FIG. 6B, an offset amount $Q_{on}$, of the arithmetic average value $aZ_{on}$ of the load impedance Z during the pulse-on period $T_{on}$ from the matching point $Z_S$ is smaller than an offset amount $Q_{off}$ of the arithmetic average value $aZ_{off}$ of the load impedance Z during the pulse-off period $T_{off}$. That is, the offset amounts $Q_{on}$ and $Q_{off}$ are in a relationship of $Q_{on}$:$Q_{off}$ ⇔(1−K):K.

Figure 6C:
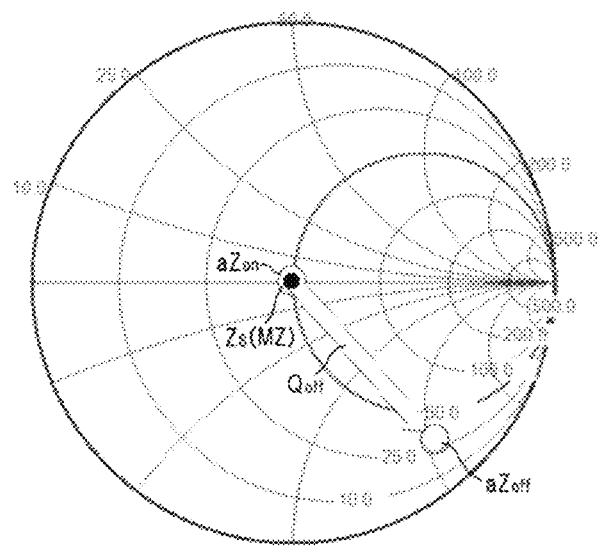
FIG. 6C is a Smith cart for describing the matching operation when the weighted variable k for weighted averaging is set to be K=1.

Especially, when K=1, the value of $(1-K)*aZ_{off}$ of the second term of the equation (5) is zero (0), and, as shown in a Smith chart of FIG. 6C, the arithmetic average value $aZ_{on}$ of the load impedance Z during the pulse-on period $T_{on}$ is equal to or approximate to the matching point $Z_S$. Meanwhile, the arithmetic average value $aZ_{off}$ of the load impedance Z during the pulse-off period $T_{off}$ is offset furthest from the matching point $Z_S$.

As stated above, when 0.5<K≤1, the load impedance Z during the pulse-on period $T_{on}$ is closer to the matching point $Z_S$ than the load impedance Z during the pulse-off period $T_{off}$. Thus, as schematically depicted in waveform diagrams of FIG. 6A, a reflection wave power $PR_{on}$ during the pulse-on period $T_{on}$ is comparatively smaller than a reflection wave power $PR_{off}$ during the pulse-off period $T_{off}$, so that a load power (input power) $PL_{on}$ during the pulse-on period $T_{on}$ is larger than a load power $PL_{off}$ during the pulse-off period $T_{off}$. Accordingly, it is possible to maintain plasma stably during the pulse-on period in the second power modulation method, and, thus, an expected effect such as, but not limited to, acceleration of plasma etching during the pulse-on period can be appropriately achieved and adjusted.

Figure 7B:
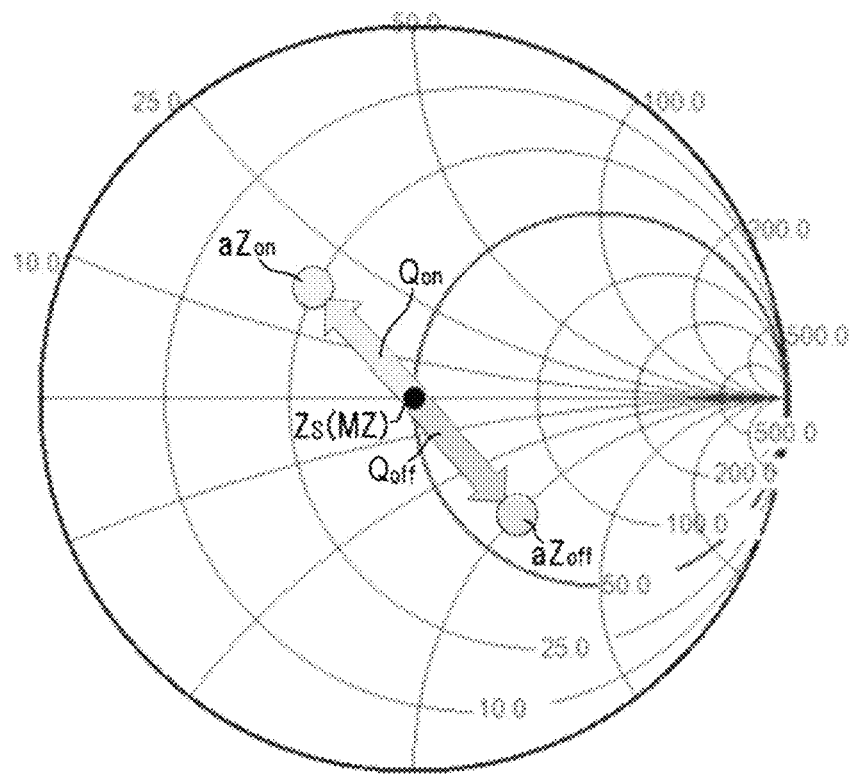
FIG. 7B is a Smith chart for describing the matching operation when the weighted variable k for weighted averaging is set to be K=0.5.

Further, when K=0.5, since the weighted value K for $aZ_{on}$ of the first term on the right side of the equation (5) for the weighted averaging is equal to the weighted value (1−K) for $aZ_{off}$ of the second term of the equation (5), a relationship of $Q_{on}$⇔$Q_{off}$ is established, as depicted in a Smith chart of FIG. 7B. Accordingly, as schematically illustrated in waveform diagrams of FIG. 7A, the reflection wave power $PR_{on}$ during the pulse-on period $T_{on}$ is approximately equal to the reflection wave power $PR_{off}$ during the pulse-off period $T_{off}$, so that the load power (input power) $PL_{on}$ during the pulse-on period $T_{on}$ is approximately equal to the load power $PL_{off}$ during the pulse-off period $T_{off}$.

Furthermore, when 0≤K<0.5, since the weighted value K for $aZ_{on}$ of the first term on the right side of the equation (5) for the weighted averaging is smaller than the weighted value (1−K) for $aZ_{off}$ of the second term of the equation (5), a relationship of $Q_{on}$>$Q_{off}$ is established, and the arithmetic average value $aZ_{on}$ of the load impedance Z during the pulse-on period $T_{on}$ is relatively far from the matching point $Z_S$, whereas the arithmetic average value $aZ_{off}$ of the load impedance Z during the pulse-off period $T_{off}$ is relatively close to the matching point $Z_S$.

Figure 8A:
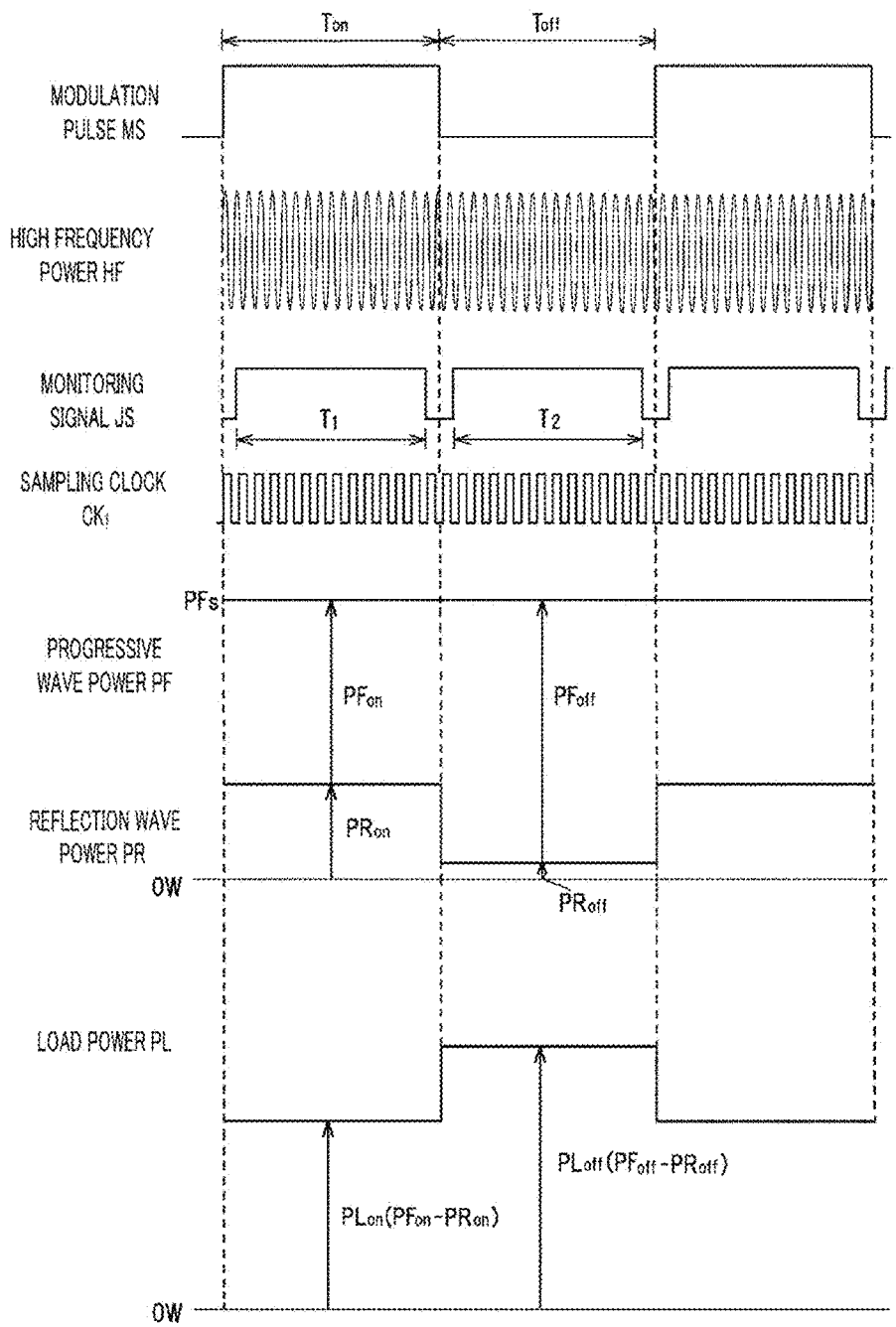
FIG. 8A are diagrams showing waveforms of respective components when the weighted variable k for weighted averaging is selected within a range of 0<K≤0.5.
Figure 8B:
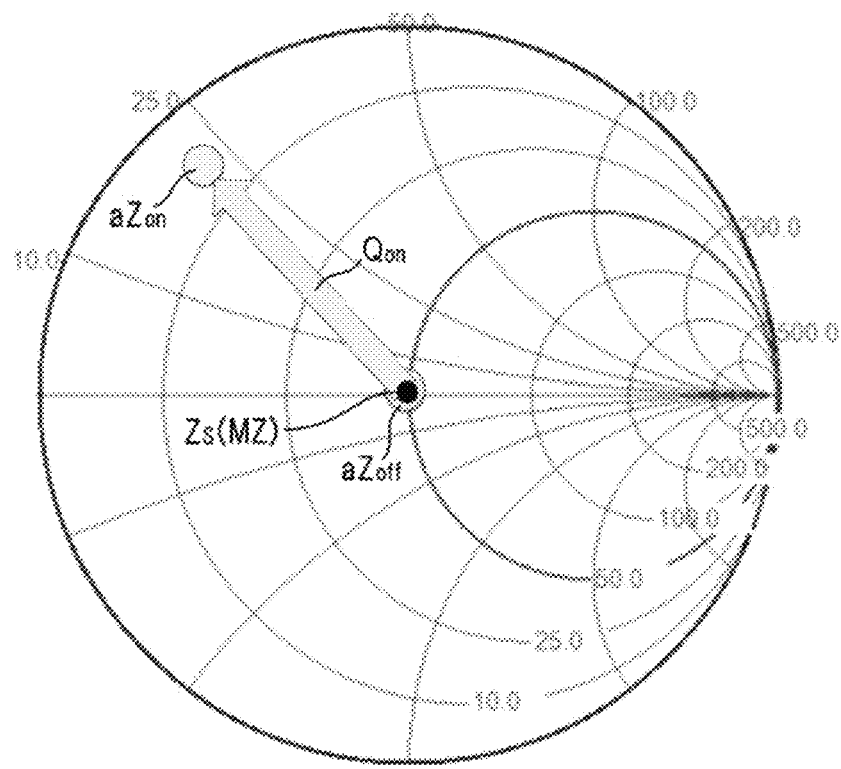
FIG. 8B is a Smith chart for describing the matching operation when the weighted variable k for weighted averaging is set to be K=0.

Especially, when K=0, the value of $K*aZ_{on}$ of the first term of the equation (5) is zero (0), and, as shown in a Smith chart of FIG. 8B, the arithmetic average value $aZ_{off}$ of the load impedance Z during the pulse-off period $T_{off}$ is equal to or approximate to the matching point $Z_S$. Meanwhile, the arithmetic average value $aZ_{on}$ of the load impedance Z during the pulse-on period $T_{on}$ is offset furthest from the matching point $Z_S$.

Accordingly, as schematically depicted in waveform diagrams of FIG. 8A, the reflection wave power $PR_{on}$ during the pulse-on period $T_{on}$ is larger than the reflection wave power $PR_{off}$ during the pulse-off period $T_{off}$, so that the load power $PL_{off}$ during the pulse-off period $T_{off}$ is larger than the load power $PL_{on}$ during the pulse-on period $T_{on}$. Accordingly, it is possible to maintain plasma stably even in the pulse-off period of the second power modulation method, and, thus, an expected effect such as, but not limited to, formation of a deposited film during the pulse-off period $T_{off}$ can be appropriately achieved and adjusted.

As stated above, in accordance with the present example embodiment, it is possible to vary a ratio between the input power $PL_{on}$ during the pulse-on period $T_{on}$ and the input power $PL_{off}$ during the pulse-off period $T_{off}$ independently from the duty ratio $D_S$ of the modulation pulse MS. The main control unit 72 may set the weighted variable K for a process recipe to be in the range from 0≤K≤1, and may change the weighted variable K for individual processes or may vary the weighted variable in the step shape or continuously.

Further, in the matching device 42 of the ion attraction system, the weighted variable K is not assigned to the impedance sensor 96B from the main control unit 72, and the weighted-average-value calculating circuits 106 and 108 are not operated. The impedance calculating circuit 120 divides the moving weighted average value dV of the voltage detection signals V outputted from the moving-average-value calculating circuit 108 of the voltage sensor system by the moving weighted average value dI of the electric current detection signals I outputted from the moving-average-value calculating circuit 118 of the electric current sensor system, i.e., performs an operation of dZ=dV/dI for each cycle of the clock $CK_3$, and outputs this calculated value, i.e., the moving weighted average value dZ of the load impedance as the load impedance measurement value MZ. The load impedance measurement value MZ depends on neither the weighted variable K nor the duty ratio $D_S$ of the modulation pulse MS.

The matching controller 94B within the matching device 42 follows up and responds to the load impedance measurement value MZ outputted from the impedance calculating circuit 120 within the impedance sensor 96B with the cycle of the clock $CK_4$, and controls the motors 90B and 92B to adjust reactances of the reactance elements $X_{L1}$ and $X_{L2}$ within the matching circuit 88B such that a phase of the load impedance measurement value MZ is zero (0) and an absolute value thereof is 50Ω, i.e., such that the load impedance measurement value MZ is equal to or approximate to the matching point $Z_S$. In this case, the arithmetic average value $aZ_{on}$ of the load impedance Z during the pulse-on period $T_{on}$ or the moving average value $cZ_{on}$ thereof always becomes the matching target point.

Example on Effect of the Example Embodiment

The present inventors have investigated effects in the above-described example embodiment in a plasmas etching experiment by using the second power modulation method. In this experiment, processing conditions are set to be as follows: the etching gas is $CF_4$; the chamber internal pressure is 18 mTorr; the frequency $f_{HF}$ and the output power of the high frequency power HF for plasma generation are 40 MHz and 1000 W, respectively; the frequency $f_{LF}$ and the output power of the high frequency power LF for ion attraction are 12.88 MHz and 2000 W, respectively; the frequency $f_S$ of the modulation pulse MS is 1 kHz; and the weighted variable K is set to be K=0.8, K=0.5, and K=0.1. The duty ratio $D_S$ of the modulation pulse MS is 40% when K=0.8 and 70% when K=0.5 and K=0.1. In each case of K=0.8, 0.5 and 0.1, the waveforms of the progressive wave power (HF/PF) and the reflection wave power (HF/PR) on the high frequency transmission line 43 of the plasma generation system and the waveforms of the progressive wave power (LF/PF) and the reflection wave power (LF/PR) on the high frequency transmission line 45 of the ion attraction system are observed with an oscilloscope.

Figure 9:
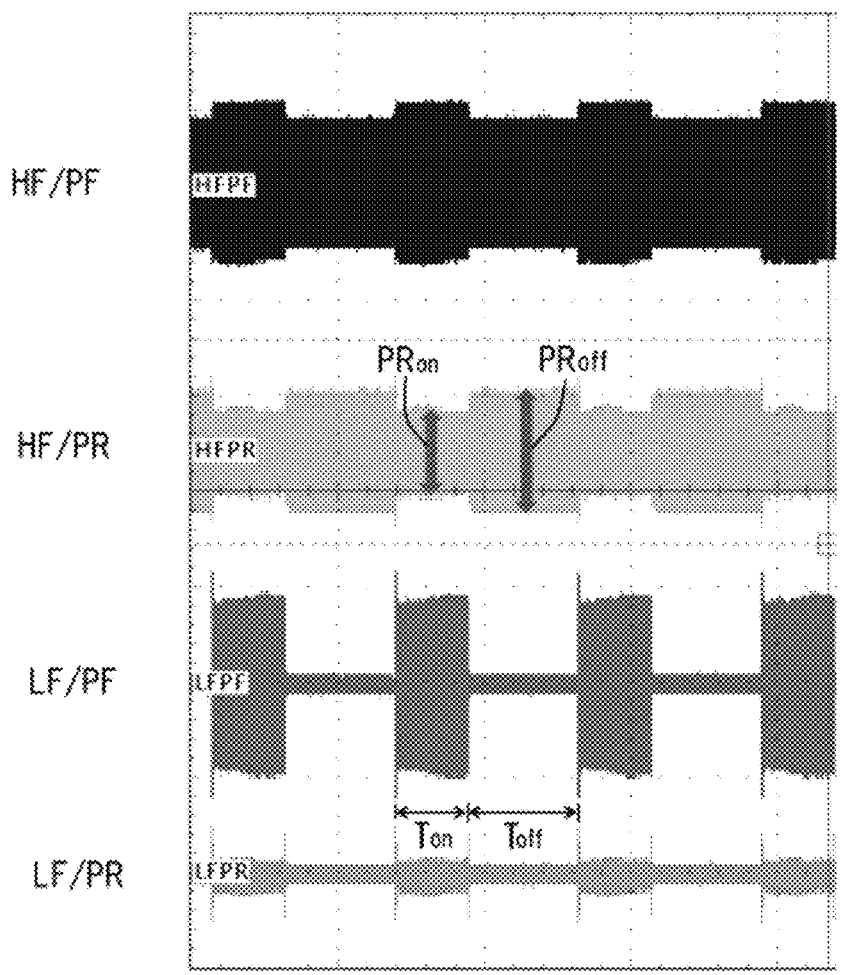
FIG. 9 are oscilloscope waveforms showing waveforms of respective components obtained when K=0.8 in a verification experimental example in accordance with the example embodiment.

When K=0.8, it is observed, as depicted in FIG. 9, that the reflection wave power $PR_{on}$ of the high frequency power HF for plasma generation, which is the continuous wave without undergoing the power modulation, during the pulse-on period $T_{on}$ is smaller than the reflection wave power $PR_{off}$ during the pulse-off period $T_{off}$.

Figure 10:
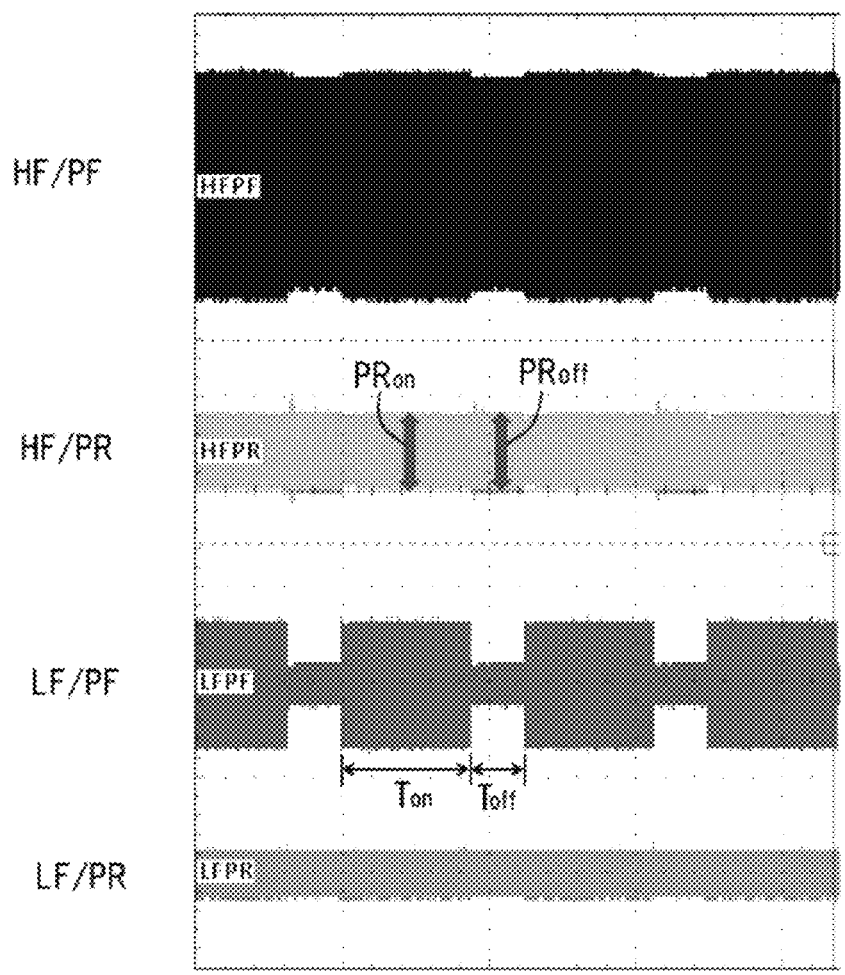
FIG. 10 are oscilloscope waveforms showing waveforms of respective components obtained when K=0.5 in the experimental example.

When K=0.5, it is observed, as depicted in FIG. 10, that the reflection wave power $PR_{on}$ of the high frequency power HF for plasma generation, which is a continuous wave without undergoing the power modulation, during the pulse-on period $T_{on}$ is approximately equal to the reflection wave power $PR_{off}$ during the pulse-off period $T_{off}$.

Figure 11:
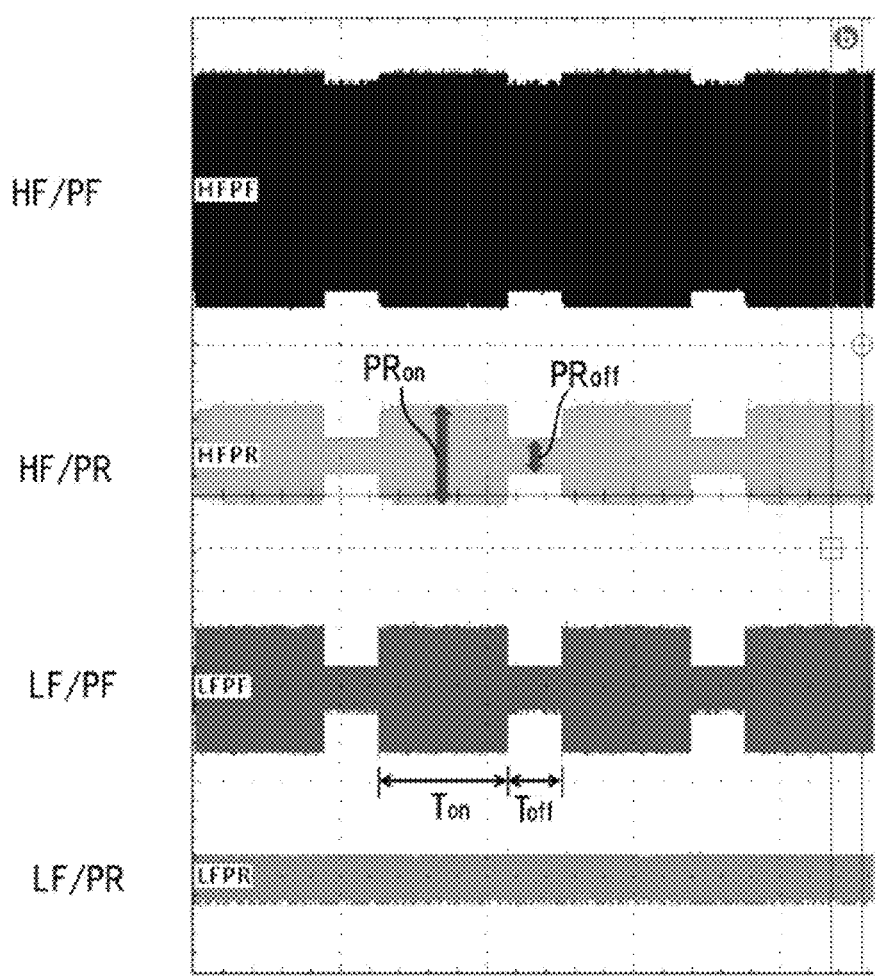
FIG. 11 are oscilloscope waveforms showing waveforms of respective components obtained when K=0.1 in the experimental example.

When K=0.1, it is observed, as depicted in FIG. 11, that the reflection wave power $PR_{off}$ of the high frequency power HF for plasma generation, which is a continuous wave without undergoing the power modulation, during the pulse-off period $T_{off}$ is remarkably smaller than the reflection wave power $PR_{on}$ during the pulse-on period $T_{on}$.

Second Experimental Example of Impedance Sensor

Figure 12:
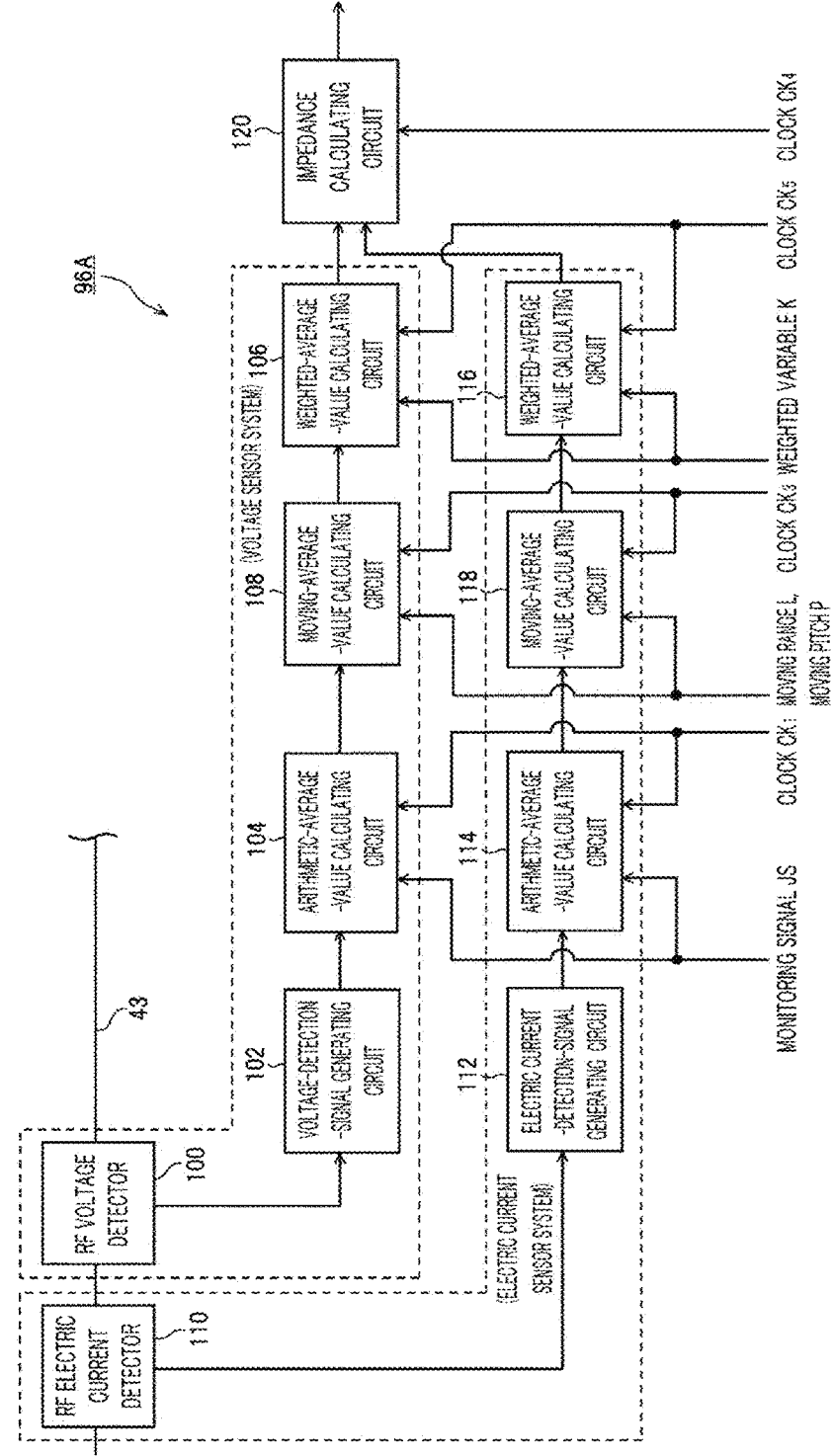
FIG. 12 is a block diagram illustrating a configuration of an impedance sensor in accordance with a second experimental example.

According to the above-described first experimental example of the impedance sensor, the weighted-average-value calculating circuits 106 and 116 are provided between the arithmetic-average-value calculating circuits 104 and 114 and the moving-average-value calculating circuits 108 and 118, respectively, in the impedance sensor 96A of the matching device 40 of the plasma generation system. However, as a second experimental example, as depicted in FIG. 12, the weighted-average-value calculating circuits 106 and 116 may be provided at the rear end of the moving-average-value calculating circuits 108 and 118, respectively. Likewise, the impedance sensor 96B of the matching device 42 of the ion attraction system may also have this configuration, though description thereof is omitted here.

In this case, in the second power modulation method, i.e., when the high frequency power HF for plasma generation is the continuous wave, the moving-average-value calculating circuit 108 of the voltage sensor system calculates a moving average value $eV_{on}$ of the voltage detection signals V during the pulse-on period $T_{on}$ and a moving average value $eV_{off}$ of the voltage detection signals V during the pulse-off period $T_{off}$ based on the multiple (n number of) consecutive arithmetic average values $aV_{on}$ of the voltage detection signals V during the pulse-on period $T_{on}$ and arithmetic average values aV$_{off}$ of the voltage detection signals V during the pulse-off period T$_{off}$ obtained from the arithmetic-average-value calculating circuit 104.

Likewise, in the second power modulation method, i.e., when the high frequency power HF for plasma generation is the continuous wave, the moving-average-value calculating circuit 118 of the electric current sensor system calculates a moving average value eI$_{on}$ of the electric current detection signals I during the pulse-on period T$_{on}$ and a moving average value eI$_{off}$ of the electric current detection signals I during the pulse-off period T$_{off}$ based on the multiple (n number of) consecutive arithmetic average values aI$_{on}$ of the electric current detection signals I during the pulse-on period T$_{on}$ and arithmetic average values aI$_{off}$ of the electric current detection signals I during the pulse-off period T$_{off}$ obtained from the arithmetic-average-value calculating circuit 114.

On the other hand, in the first power modulation method, i.e., when the high frequency power HF for plasma generation is in the pulse shape, the moving-average-value calculating circuit 108 of the voltage sensor system calculates a moving average value dV of the voltage detection signals V based on the multiple (n number of) consecutive arithmetic average values aV$_{on}$ of the voltage detection signals V during the pulse-on period T$_{on}$ outputted from the arithmetic-average-value calculating circuit 104. The moving-average-value calculating circuit 118 of the electric current sensor system also calculates a moving average value dI of the electric current detection signals I based on the multiple of (n number of) consecutive arithmetic average values aI$_{on}$ of the electric current detection signals I during the pulse-on period T$_{on}$ outputted from the arithmetic-average-value calculating circuit 114.

The weighted-average-value calculating circuit 106 of the voltage sensor system is operated when the high frequency power HF for plasma generation is the continuous wave under the second power modulation method. Further, the weighted-average-value calculating circuit 106 calculates a weighted moving average value fV of the voltage detection signals V by weighted-averaging the moving average value eV$_{on}$ of the voltage detection signals V during the pulse-on period T$_{on}$ and the moving average value eV$_{off}$ of the voltage detection signals V during the pulse-off period T$_{off}$, which are obtained from the moving-average-value calculating circuit 108, with the preset weighted value (weighted variable K). Then, the weighted-average-value calculating circuit 106 sends the weighted moving average value fV to the impedance calculating circuit 120. The weighted moving average value fV is represented by the following equation (7).

$$fV = K*eV_{on} + (1-K)*eV_{off} \quad (7)$$

The weighted-average-value calculating circuit 116 of the electric current sensor system is operated when the high frequency power HF for plasma generation is the continuous wave under the second power modulation method. Further, the weighted-average-value calculating circuit 116 calculates a weighted moving average value fI of the electric current detection signals I by weighted-averaging the moving average value eI$_{on}$ of the electric current detection signals I during the pulse-on period T$_{on}$ and the moving average value eI$_{off}$ of the electric current detection signals I during the pulse-off period T$_{off}$ with the preset weighted value (weighted variable K). Then, the weighted-average-value calculating circuit 116 sends the weighted moving average value fI to the impedance calculating circuit 120. The weighted moving average value fI is represented by the following equation (8).

$$fI = K*eI_{on} + (1-K)*eI_{off} \quad (8)$$

If, however, the high frequency power HF is in the pulse shape under the first power modulation method, neither of the weighted-average-value calculating circuits 106 and 116 is operated, and the moving average value dV of the voltage detection signals V and the moving average value dI of the electric current detection signals I during the pulse-on period T$_{on}$ which are outputted from the moving-average-value calculating circuits 108 and 118 are directly sent to the impedance calculating circuit 120 without passing through the weighted-average-value calculating circuits 106 and 116, respectively.

When the high frequency power HF for plasma generation is the continuous wave under the second power modulation method, the impedance calculating circuit 120 calculates a measurement value MZ of the load impedance Z on the high frequency transmission line 43 with respect to the high frequency power supply 36 by dividing the weighted moving average value fV of the voltage detection signals V obtained from the weighted-average-value calculating circuit 106 by the weighted moving average value fI of the electric current detection signals I obtained from the weighted-average-value calculating circuit 116.

On the other hand, when the high frequency power HF for plasma generation is in the pulse shape under the first power modulation method, the impedance calculating circuit 120 calculates the measurement value MZ of the load impedance Z on the high frequency transmission line 43 with respect to the high frequency power supply 36 by dividing the moving average value dV of the voltage detection signals V obtained from the moving-average-value calculating circuit 108 of the voltage sensor system by the moving average value dI of the electric current detection signals I obtained from the moving-average-value calculating circuit 118 of the electric current sensor system.

Third Experimental Example of Impedance Sensor

Figure 13:
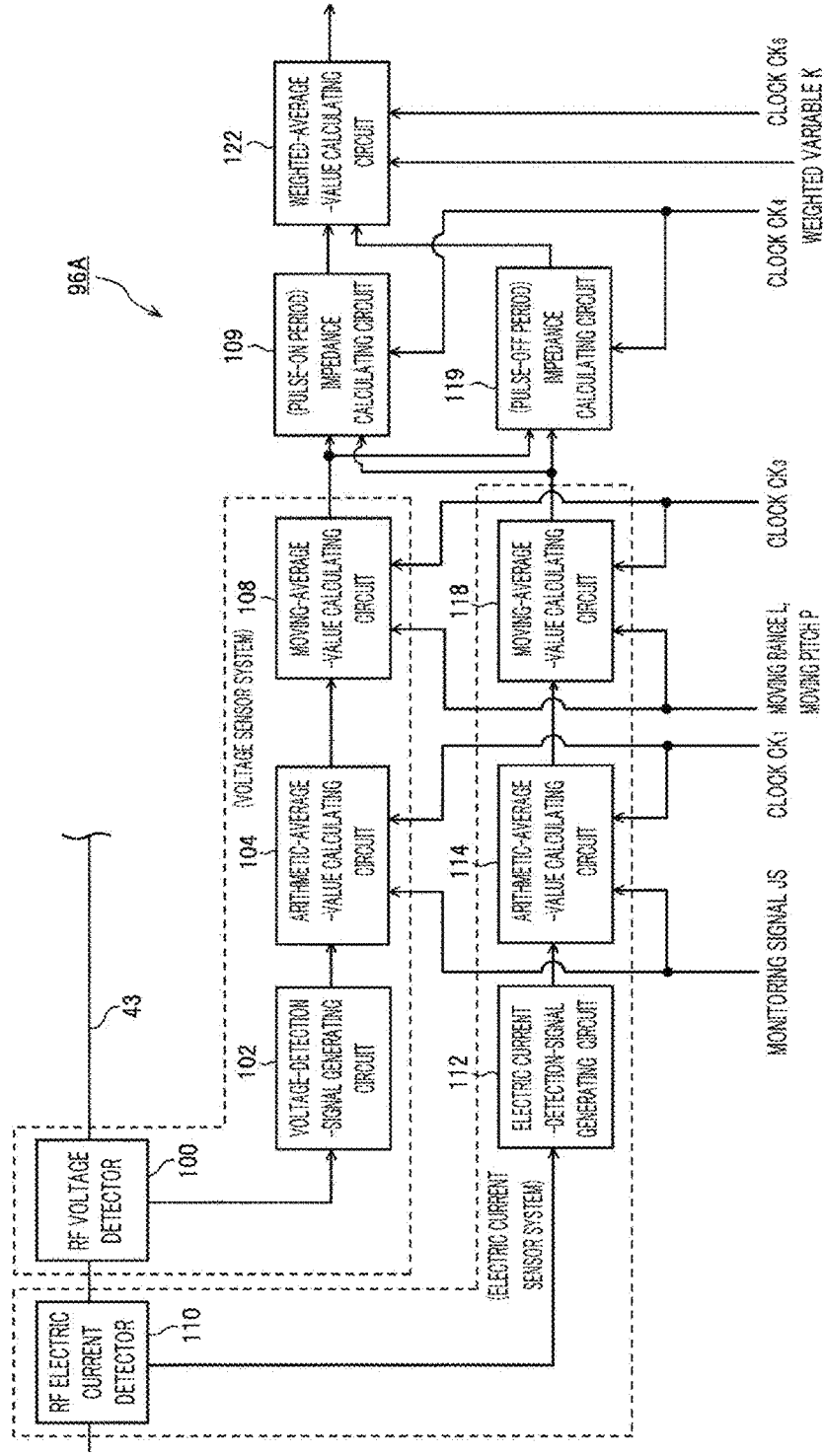
FIG. 13 is a block diagram illustrating a configuration of an impedance sensor in accordance with a third experimental example.

FIG. 13 illustrates a third experimental example of the impedance sensor. As shown in the figure, within the impedance sensor 96A within the matching device 40 of the plasma generation system, an impedance calculating circuit 109 for the pulse-on period and an impedance calculating circuit 119 for the pulse-off period may be provided at the rear ends of the moving-average-value calculating circuits 108 and 118, respectively, and a single weighted-average-value calculating circuit 122 may be provided at the rear end of the impedance calculating circuits 109 and 119. Likewise, the impedance sensor 96B within the moving device 42 of the ion attraction system may also have the same configuration, though description thereof is omitted here.

According to the third experimental example, when the high frequency power HF for plasma generation is the continuous wave under the second power modulation method, the moving average value eV$_{on}$ of the voltage detection signals V during the pulse-on period T$_{on}$ and the moving average value eV$_{off}$ of the voltage detection signals V during the pulse-off period T$_{off}$ outputted from the moving-average-value calculating circuit 108 of the voltage sensor system are sent to the impedance calculating circuit 109 for the pulse-on period and the impedance calculating circuit 119 for the pulse-off period, respectively. Likewise, the moving average value eI$_{on}$ of the electric current detection signals I during the pulse-on period T$_{on}$ and the moving average value eI$_{off}$ of the electric current detection signals I during the pulse-off period T$_{off}$ outputted from the moving-average-value calculating circuit 118 of the electric current sensor system are sent to the impedance calculating circuit 109 for the pulse-on period and the impedance calculating circuit 119 for the pulse-off period, respectively.

The impedance calculating circuit 109 for the pulse-on period calculates a moving average value gZ$_{on}$ of the load impedance Z during the pulse-on period T$_{on}$ by dividing the moving average value eV$_{on}$ of the voltage detection signals V during the pulse-on period T$_{on}$ by the moving average value eI$_{on}$ of the electric current detection signals I during the pulse-on period T$_{on}$, i.e., by performing an operation of gZ$_{on}$=eV$_{on}$/eI$_{on}$.

Meanwhile, the impedance calculating circuit 119 for the pulse-off period calculates a moving average value gZ$_{off}$ of the load impedance Z during the pulse-off period T$_{off}$ by dividing the moving average value eV$_{off}$ of the voltage detection signals V during the pulse-off period T$_{off}$ by the moving average value eI$_{off}$ of the electric current detection signals I during the pulse-off period T$_{off}$, i.e., by performing an operation of gZ$_{off}$=eV$_{off}$/eI$_{off}$.

The weighted-average-value calculating circuit 122 calculates a weighted moving average value hZ of the load impedance Z by weighted-averaging the moving average value gZ$_{on}$ of the load impedance Z during the pulse-on period T$_{on}$ obtained from the impedance calculating circuit 109 for the pulse-on period and the moving average value gZ$_{off}$ of the load impedance Z during the pulse-off period T$_{off}$ obtained from the impedance calculating circuit 119 for the pulse-off period with the preset weighted value (weighted variable K). Then, the weighted-average-value calculating circuit 122 outputs the weighted moving average value hZ as the load impedance measurement value MZ. The weighted moving average value hZ of the load impedance Z is represented by the following equation (9).

$$hZ=K*gZ_{on}+(1 \times K)*gZ_{off} \quad (9)$$

Further, when the high frequency power for plasma generation HF is in the pulse shape under the first power modulation method, neither the weighted-average-value calculating circuit 122 nor the impedance calculating circuit 119 for the pulse-off period is operated. In this case, the moving average value gZ$_{on}$ of the load impedance Z during the pulse-on period T$_{on}$ obtained from the impedance calculating circuit 109 for the pulse-on period is outputted as the load impedance measurement value MZ.

Fourth Experimental Example of Impedance Sensor

Figure 14:
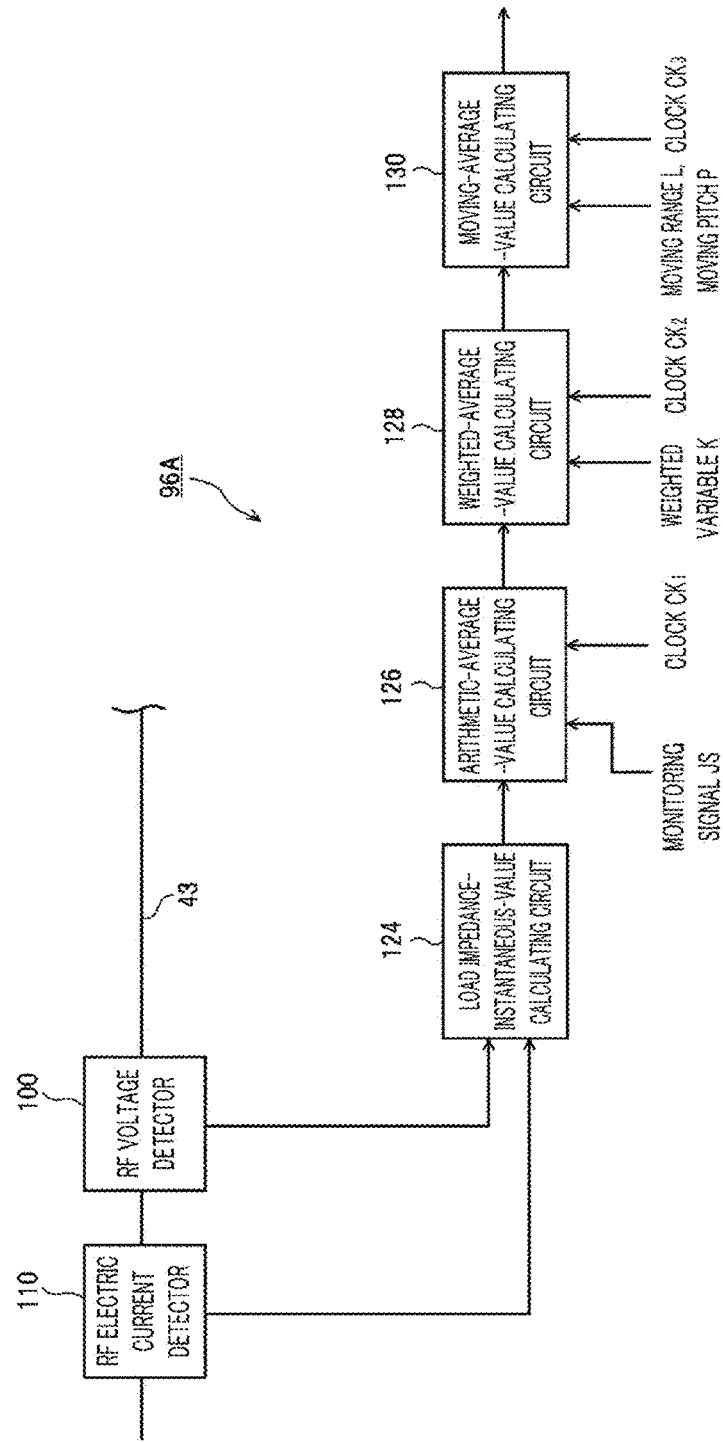
FIG. 14 is a block diagram illustrating a configuration of an impedance sensor in accordance with a fourth experimental example.

As a fourth experimental example of the impedance sensor, as depicted in FIG. 14, the impedance sensor 96A within the matching device 40 of the plasma generation system may be composed of the RF voltage detector 100, the RF electric current detector 110, a load impedance-instantaneous-value calculating circuit 124, an arithmetic-average-value calculating circuit 126, a weighted-average-value calculating circuit 128 and a moving average value calculating circuit 130. The impedance sensor 96B within the matching device 42 of the ion attraction system may also have the same configuration.

Here, the load impedance-instantaneous-value calculating circuit 124 calculates an instantaneous value JZ of the load impedance Z on the high frequency transmission line 43 based on the voltage detection signals V and the electric current detection signals I obtained from the RF voltage detector 100 and the RF electric current detector 110, respectively. Desirably, the load impedance-instantaneous-value calculating circuit 124 may be a digital circuit, through it may also be implemented by an analog circuit as well.

When the high frequency power HF for plasma generation is the continuous wave under the second power modulation method, in each cycle of a modulation pulse MS, the arithmetic-average-value calculating circuit 126 samples the instantaneous values JZ of the load impedance Z, which are obtained from the load impedance-instantaneous-value calculating circuit 124 during the pulse-on period T$_{on}$ with the preset sampling frequency f$_C$ and calculates an arithmetic average value aZ$_{on}$ of the load impedance Z during the pulse-on period T$_{on}$. Further, the arithmetic-average-value calculating circuit 126 also samples, with the preset sampling frequency f$_C$, the instantaneous values JZ of the load impedance Z, which are obtained from the load impedance-instantaneous-value calculating circuit 124 during the pulse-off period T$_{off}$, and calculates an arithmetic average value aZ$_{off}$ of the load impedance Z during the pulse-off period T$_{off}$.

If, however, the high frequency power HF for plasma generation is in the pulse shape under the first power modulation method, in each cycle of the modulation pulse MS, the arithmetic-average-value calculating circuit 126 samples the instantaneous values JZ of the load impedance Z, which are obtained from the load impedance-instantaneous-value calculating circuit 124, with the preset sampling frequency f$_C$ only during the pulse-on period T$_{on}$, and calculates an arithmetic average value aZ$_{on}$ of the load impedance Z during the pulse-on period T$_{on}$.

When the high frequency power HF for plasma generation is the continuous wave under the second power modulation method, the weighted-average-value calculating circuit 128 calculates a weighted average value bZ of the load impedance for the single cycle by weighted-averaging the arithmetic average value aZ$_{on}$ of the load impedance Z during the pulse-on period T$_{on}$ and the arithmetic average value aZ$_{off}$ of the load impedance Z during the pulse-off period T$_{off}$, which are obtained from the arithmetic-average-value calculating circuit 126, with the weighted value (weighted variable K). The weighted average value bZ is represented by the following equation (10).

$$bZ=K*aZ_{on}+(1 \times K)*aZ_{off} \quad (10)$$

However, if the high frequency power HF for plasma generation is with the pulse under the first power modulation method, the weighted-average-value calculating circuit 128 is not operated, and the arithmetic average value aZ$_{on}$ of the load impedance Z during the pulse-on period T$_{on}$ obtained from the arithmetic-average-value calculating circuit 126 is directly sent to the moving-average-value calculating circuit 130 without passing through the weighted-average-value calculating circuit 128.

In the second power modulation method, i.e., when the high frequency power HF for plasma generation is the continuous wave, the moving-average-value calculating circuit 130 calculates a moving weighted average value cZ of the load impedance Z based on the multiple (n number of) consecutive weighted average values bZ of the load impedance Z for the single cycle obtained from the weighted-average-value calculating circuit 128. This moving weighted average value cZ is outputted as the load impedance measurement value MZ.

However, in the first power modulation method, i.e., when the high frequency power HF is in the pulse shape, the moving-average-value calculating circuit 130 calculates a moving weighted average value cZ of the load impedance Z based on the multiple (n number of) consecutive arithmetic average values $aZ_{on}$ of the load impedance Z during the pulse-on period $T_{on}$ outputted form the arithmetic-average-value calculating circuit 126. Further, a moving weighted average value dZ of the electric detection signals I is calculated. This moving weighted average value dZ is outputted as the load impedance measurement value MZ.

Fifth Experimental Example Regarding Impedance Sensor

Figure 15:
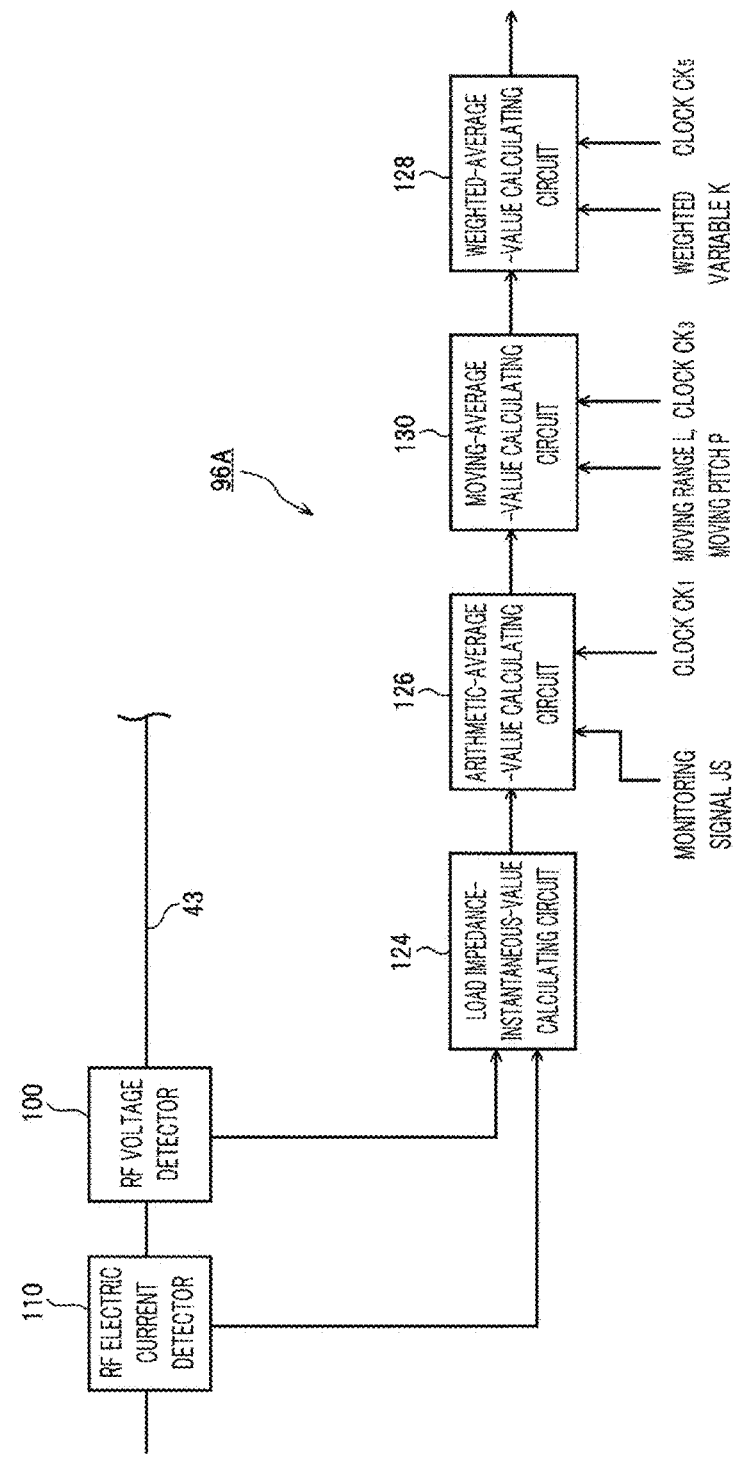
FIG. 15 is a block diagram illustrating a configuration of an impedance sensor in accordance with a fifth experimental example.

As a modification example of the fourth experimental example or as a fifth experimental example, the weighted-average-value calculating circuit 128 may be provided at the rear end of the moving-average-value calculating circuit 130, as depicted in FIG. 15.

In the second power modulation method, i.e., when the high frequency power HF for plasma generation is the continuous wave, the moving-average-value calculating circuit 130 calculates a moving average value $eZ_{on}$ of the load impedance Z during the pulse-on period $T_{on}$ and a moving average value $eZ_{off}$ of the load impedance Z during the pulse-off period $T_{off}$ based on the multiple (n number of) consecutive arithmetic average values $aZ_{on}$ of the load impedance Z during the pulse-on period $T_{on}$ and arithmetic average values $aZ_{off}$ of the load impedance Z during the pulse-off period $T_{off}$ obtained from the arithmetic average value calculating circuit 126.

The weighted-average-value calculating circuit 128 is operated when the high frequency power for plasma generation is the continuous wave under the second power modulation method. Further, the weighted-average-value calculating circuit 128 calculates a weighted moving average value fZ of the load impedance Z by weighted-averaging the moving average value $eZ_{on}$ of the load impedance Z during the pulse-on period $T_{on}$ and the moving average value $eZ_{off}$ of the load impedance Z during the pulse-off period $T_{off}$, which are obtained from the moving-average-value calculating circuit 130, with the preset weighted value (weighted variable K). Then, the weighted-average-value calculating circuit 128 outputs the weighted moving average value fZ as the load impedance measurement value MZ. The weighted moving average value fZ is represented by the following equation (11).

$$fZ = K^* eZ_{on} + (1-K)^* eZ_{off} \quad (11)$$

If, however, the high frequency power HF is in the pulse shape under the first power modulation method, the weighted-average-value calculating circuit 128 is not operated, and the moving average value $eZ_{on}$ of the load impedance Z during the pulse-on period $T_{on}$ outputted from the moving-average-value calculating circuit 130 is outputted as the load impedance measurement value MZ.

Other Example Embodiments or Modification Examples

While the present disclosure has been described with respect to the example embodiments, the example embodiments are not intended to be limiting, and various modifications may be made without departing from the scope and sprit of the present disclosure.

In the example embodiments, as the first power modulation method, a first period during which the high frequency power HF for plasma generation is maintained at a first level (H level) and a second period during which the high frequency power HF is maintained at a second level (L level) lower than the first level (H level) may be repeated alternately at a certain pulse frequency. Likewise, as the second power modulation method, a first period during which the high frequency power LF for ion attraction is maintained at a first level (H level) and a second period during which the high frequency lower LF is maintained at a second level (L level) lower than the first level (H level) may be repeated alternately at a certain pulse frequency.

In the above-described example embodiments (FIG. 1), the high frequency power HF for plasma generation is applied to the susceptor (lower electrode) 16. However, the high frequency power HF for plasma generation may be applied to the upper electrode 46 instead.

The example embodiments may not be limited to the capacitively coupled plasma etching apparatus and can be applied to a capacitively coupled plasma processing apparatus configured to perform various plasma processes such as plasma CVD, plasma ALD, plasma oxidation, plasma nitrification, sputtering, and so forth. Furthermore, the example embodiments may also be applied to an inductively coupled plasma processing apparatus in which a high frequency electrode (antenna) is provided in the vicinity of a chamber. Further, the processing target object of the example embodiments may not be limited to the semiconductor wafer, but various types of substrates for a flat panel display, an organic EL or a solar cell, or a photo mask, a CD substrate, and a printed circuit board may also be used.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A plasma processing apparatus of generating plasma by high frequency discharge of a processing gas within a decompression processing vessel that accommodates therein a processing target object, which is loaded into and unloaded from the processing vessel, and performing a process on the processing target object within the processing vessel under the plasma, the plasma processing apparatus comprising:
   a first high frequency power supply configured to output a first high frequency power;
   a first high frequency transmission line configured to transmit the first high frequency power outputted from the first high frequency power supply to a first electrode provided within or in the vicinity of the processing vessel;
   a first matching device, having a variable reactance element provided on the first high frequency transmission line and a first impedance sensor configured to measure a load impedance on the first high frequency transmission line with respect to the first high frequency power supply, configured to control a reactance of the variable reactance element such that a load impedance measurement value outputted from the first impedance sensor is equal to or approximate to a matching point corresponding to an output impedance of the first high frequency power supply;
   a second high frequency power supply configured to output a second high frequency power;
   a second high frequency transmission line configured to transmit the second high frequency power outputted from the second high frequency power supply to the first electrode or a second electrode provided within or in the vicinity of the processing vessel; and a power modulation unit configured to pulse-modulate an output of the second high frequency power supply with a pulse such that a pulse-on period during which the second high frequency power is turned on or has a first level and a pulse-off period during which the second high frequency power is turned off or has a second level lower than the first level are repeated alternately at a regular frequency, wherein the first impedance sensor outputs the load impedance measurement value corresponding to a weighted average value obtained by weighted-averaging an average value of the load impedance during the pulse-on period and an average value of the load impedance during the pulse-off period with a preset weighted value independent from a duty ratio of the pulse.

2. The plasma processing apparatus of claim 1, wherein the first impedance sensor comprises:

a first arithmetic-average-value calculating circuit configured to, in each cycle of the pulse, sample voltage detection signals corresponding to the first high frequency power obtained on the first high frequency transmission line during the pulse-on period with a preset sampling frequency and calculate an arithmetic average value of the voltage detection signals during the pulse-on period, and, also, configured to sample voltage detection signals obtained on the first high frequency transmission line during the pulse-off period with the preset sampling frequency and calculate an arithmetic average value of the voltage detection signals during the pulse-off period;

a second arithmetic-average-value calculating circuit configured to, in each cycle of the pulse, sample electric current detection signals corresponding to the first high frequency power obtained on the first high frequency transmission line during the pulse-on period with the preset sampling frequency and calculate an arithmetic average value of the electric current detection signals during the pulse-on period, and, also, configured to sample electric current detection signals obtained on the first high frequency transmission line during the pulse-off period with the preset sampling frequency and calculate an arithmetic average value of the electric current detection signals during the pulse-off period;

a first weighted-average-value calculating circuit configured to calculate a weighted average value of the voltage detection signals for a single cycle by weighted-averaging the arithmetic average value of the voltage detection signals during the pulse-on period and the arithmetic average value of the voltage detection signals during the pulse-off period obtained from the first arithmetic-average-value calculating circuit;

a second weighted-average-value calculating circuit configured to calculate a weighted average value of the electric current detection signals for the single cycle by weighted-averaging the arithmetic average value of the electric current detection signals during the pulse-on period and the arithmetic average value of the electric current detection signals during the pulse-off period obtained from the second arithmetic-average-value calculating circuit;

a first moving-average-value calculating circuit configured to calculate a moving weighted average value of the voltage detection signals based on multiple consecutive weighted average values of the voltage detection signals for the single cycle obtained from the first weighted-average-value calculating circuit;

a second moving-average-value calculating circuit configured to calculate a moving weighted average value of the electric current detection signals based on multiple consecutive weighted average values of the electric current detection signals for the single cycle obtained from the second weighted-average-value calculating circuit; and an impedance calculating circuit configured to calculate a moving weighted average value of the load impedance by dividing the moving weighted average value of the voltage detection signals obtained from the first moving-average-value calculating circuit by the moving weighted average value of the electric current detection signals obtained from the second moving-average-value calculating circuit, wherein the moving weighted average value of the load impedance obtained from the impedance calculating circuit is outputted as the load impedance measurement value.

3. The plasma processing apparatus of claim 2, wherein the first arithmetic-average-value calculating circuit and the second arithmetic-average-value calculating circuit sample the voltage detection signals and the electric current detection signals, respectively, during a first monitoring time set within the pulse-on period and calculate the arithmetic average value of the voltage detection signals during the pulse-on period and the arithmetic average value of the electric current detection signals during the pulse-on period, respectively, and, also, sample the voltage detection signals and the electric current detection signals, respectively, during a second monitoring time set within the pulse-off period and calculate the arithmetic average value of the voltage detection signals during the pulse-off period and the arithmetic average value of the electric current detection signals during the pulse-off period, respectively.

4. The plasma processing apparatus of claim 3, wherein at least one of the first monitoring time and the second monitoring time does not include a first transient time in the pulse-on period immediately after the pulse-on period is started.

5. The plasma processing apparatus of claim 3, wherein at least one of the first monitoring time and the second monitoring time does not include a second transient time in the pulse-on period immediately before the pulse-on period is ended.

6. The plasma processing apparatus of claim 1, wherein the first impedance sensor comprises:

a first arithmetic-average-value calculating circuit configured to, in each cycle of the pulse, sample voltage detection signals corresponding to the first high frequency power obtained on the first high frequency transmission line during the pulse-on period with a preset sampling frequency and calculate an arithmetic average value of the voltage detection signals during the pulse-on period, and, also, configured to sample voltage detection signals obtained on the first high frequency transmission line during the pulse-off period with the preset sampling frequency and calculate an arithmetic average value of the voltage detection signals during the pulse-off period;

a second arithmetic-average-value calculating circuit configured to, in each cycle of the pulse, sample electric current detection signals corresponding to the first high frequency power obtained on the first high frequency transmission line during the pulse-on period with the preset sampling frequency and calculate an arithmetic average value of the electric current detection signals during the pulse-on period, and, also, configured to sample electric current detection signals obtained on the first high frequency transmission line during the pulse-off period with the preset sampling frequency and calculate an arithmetic average value of the electric current detection signals during the pulse-off period;

a first moving-average-value calculating circuit configured to calculate a moving average value of the voltage detection signals during the pulse-on period and a moving average value of the voltage detection signals during the pulse-off period based on multiple consecutive arithmetic average values of the voltage detection signals during the pulse-on period and multiple consecutive arithmetic average values of the voltage detection signals during the pulse-off period obtained from the first arithmetic-average-value calculating circuit;

a second moving-average-value calculating circuit configured to calculate a moving average value of the electric current detection signals during the pulse-on period and a moving average value of the electric current detection signals during the pulse-off period based on multiple consecutive arithmetic average values of the electric current detection signals during the pulse-on period and multiple consecutive arithmetic average values of the electric current detection signals during the pulse-off period obtained from the second arithmetic-average-value calculating circuit;

a first weighted-average-value calculating circuit configured to calculate a weighted moving average value of the voltage detection signals by weighted-averaging the moving average value of the voltage detection signals during the pulse-on period and the moving average value of the voltage detection signals during the pulse-off period, which are obtained from the first moving-average-value calculating circuit, with the preset weighted value;

a second weighted-average-value calculating circuit configured to calculate a weighted moving average value of the electric current detection signals by weighted-averaging the moving average value of the electric current detection signals during the pulse-on period and the moving average value of the electric current detection signals during the pulse-off period, which are obtained from the second moving-average-value calculating circuit, with the preset weighted value; and an impedance calculating circuit configured to calculate a weighted moving average value of the load impedance by dividing the weighted moving average value of the voltage detection signals obtained from the first weighted-average-value calculating circuit by the weighted moving average value of the electric current detection signals obtained from the second weighted-average-value calculating circuit, wherein the weighted moving average value of the load impedance obtained from the impedance calculating circuit is outputted as the load impedance measurement value.

7. The plasma processing apparatus of claim 1,
wherein the first impedance sensor comprises:
a first arithmetic-average-value calculating circuit configured to, in each cycle of the pulse, sample voltage detection signals corresponding to the first high frequency power obtained on the first high frequency transmission line during the pulse-on period with a preset sampling frequency and calculate an arithmetic average value of the voltage detection signals during the pulse-on period, and, also, configured to sample voltage detection signals obtained on the first high frequency transmission line during the pulse-off period with the preset sampling frequency and calculate an arithmetic average value of the voltage detection signals during the pulse-off period;

a second arithmetic-average-value calculating circuit configured to, in each cycle of the pulse, sample electric current detection signals corresponding to the first high frequency power obtained on the first high frequency transmission line during the pulse-on period with the preset sampling frequency and calculate an arithmetic average value of the electric current detection signals during the pulse-on period, and, also, configured to sample electric current detection signals obtained on the first high frequency transmission line during the pulse-off period with the preset sampling frequency and calculate an arithmetic average value of the electric current detection signals during the pulse-off period;

a first moving-average-value calculating circuit configured to calculate a moving average value of the voltage detection signals during the pulse-on period and a moving average value of the voltage detection signals during the pulse-off period based on multiple consecutive arithmetic average values of the voltage detection signals during the pulse-on period and multiple consecutive arithmetic average values of the voltage detection signals during the pulse-off period obtained from the first arithmetic-average-value calculating circuit;

a second moving-average-value calculating circuit configured to calculate a moving average value of the electric current detection signals during the pulse-on period and a moving average value of the electric current detection signals during the pulse-off period based on multiple consecutive arithmetic average values of the electric current detection signals during the pulse-on period and multiple consecutive arithmetic average values of the electric current detection signals during the pulse-off period obtained from the second arithmetic-average-value calculating circuit;

a first impedance calculating circuit configured to calculate a moving average value of the load impedance during the pulse-on period by dividing the moving average value of the voltage detection signals during the pulse-on period obtained from the first moving-average-value calculating circuit by the moving average value of the electric current detection signals during the pulse-on period obtained from the second moving-average-value calculating circuit;

a second impedance calculating circuit configured to calculate a moving average value of the load impedance during the pulse-off period by dividing the moving average value of the voltage detection signals during the pulse-off period obtained from the first moving-average-value calculating circuit by the moving average value of the electric current detection signals during the pulse-off period obtained from the second moving-average-value calculating circuit; and a weighted-average-value calculating circuit configured to calculate a weighted moving average value of the load impedance by weighted-averaging the moving average value of the load impedance during the pulse-on period obtained from the first impedance calculating circuit and the moving average value of the load impedance during the pulse-off period obtained from the second impedance calculating circuit with the preset weighted value, wherein the weighted moving average value of the load impedance obtained from the weighted-average-value calculating circuit is outputted as the load impedance measurement value.

8. The plasma processing apparatus of claim 1,
wherein the first impedance sensor comprises:
a load impedance-instantaneous-value calculating circuit configured to calculate an instantaneous value of the load impedance based on the voltage detection signals and the electric current detection signals corresponding to the first high frequency power obtained on the first high frequency transmission line;
an arithmetic-average-value calculating circuit configured to, in each cycle of the pulse, sample instantaneous values of the load impedance obtained from the load impedance-instantaneous-value calculating circuit during the pulse-on period with a preset sampling frequency and calculate an arithmetic average value of the load impedance during the pulse-on period, and, also, configured to sample instantaneous values of the load impedance obtained from the load impedance-instantaneous-value calculating circuit during the pulse-off period with the preset sampling frequency and calculate an arithmetic average value of the load impedance during the pulse-off period;
a weighted-average-value calculating circuit configured to calculate a weighted average value of the load impedance for a single cycle by weighted-averaging the arithmetic average value of the load impedance during the pulse-on period and the arithmetic average value of the load impedance during the pulse-off period obtained from the arithmetic-average-value calculating circuit; and
a moving-average-value calculating circuit configured to calculate a moving weighted average value of the load impedance based on multiple consecutive weighted average values of the load impedance for the single cycle obtained from the weighted-average-value calculating circuit,
wherein the moving weighted average value of the load impedance obtained from the moving-average-value calculating circuit is outputted as the load impedance measurement value.

9. The plasma processing apparatus of claim 8,
wherein when the arithmetic average value of the load impedance during the pulse-on period is $aZ_{on}$, the arithmetic average value of the load impedance during the pulse-off period is $aZ_{off}$, a weighted variable defining the preset weighted value is $K(0 \leq K \leq 1)$, and the weighted average value of the load impedance is $bZ$, the weighted average value $bZ$ is represented by the following equation (1):

$$bZ = K^*aZ_{on} + (1-K)^*aZ_{off} \quad (1)$$

10. The plasma processing apparatus of claim 8,
wherein the first arithmetic-average-value calculating circuit and the second arithmetic-average-value calculating circuit sample the instantaneous values of the load impedance during a first monitoring time set within the pulse-on period and calculate an arithmetic average value of the voltage detection signals during the pulse-on period, and, also, sample instantaneous values of the load impedance during a second monitoring time set within the pulse-off period and calculate an arithmetic average value of the load impedance during the pulse-off period.

11. The plasma processing apparatus of claim 1,
wherein the first impedance sensor comprises:
a load impedance-instantaneous-value calculating circuit configured to calculate an instantaneous value of the load impedance based on the voltage detection signals and the electric current detection signals corresponding to the first high frequency power obtained on the first high frequency transmission line;
an arithmetic-average-value calculating circuit configured to, in each cycle of the pulse, sample instantaneous values of the load impedance obtained from the load impedance-instantaneous-value calculating circuit during the pulse-on period with a preset sampling frequency and calculate an arithmetic average value of the load impedance during the pulse-on period, and, also, configured to sample instantaneous values of the load impedance obtained from the load impedance-instantaneous-value calculating circuit during the pulse-off period with the preset sampling frequency and calculate an arithmetic average value of the load impedance during the pulse-off period;
a moving-average-value calculating circuit configured to calculate a moving average value of the load impedance during the pulse-on period and a moving average value of the load impedance during the pulse-off period based on multiple consecutive arithmetic average values of the load impedance during the pulse-on period and multiple consecutive arithmetic average values of the load impedance during the pulse-off period obtained from the arithmetic-average-value calculating circuit; and
a weighted-moving-average-value calculating circuit configured to calculate a weighted moving average of the load impedance by weighted-averaging the moving average value of the load impedance during the pulse-on period and the moving average value of the load impedance during the pulse-off period, which are obtained from the moving-average-value calculating circuit, with the preset weighted value,
wherein the weighted moving average value of the load impedance obtained from the weighted-moving-average-value calculating circuit is outputted as the load impedance measurement value.

12. The plasma processing apparatus of claim 8,
wherein when the moving average value of the load impedance during the pulse-on period is $eZ_{on}$, the moving average value of the load impedance during the pulse-off period is $eZ_{off}$, a weighted variable defining the preset weighted value is $K(0 \leq K \leq 1)$, and the weighted average value of the load impedance is $fZ$, the weighted average value $fZ$ is represented by the following equation (2):

$$fZ = K^*eZ_{on} + (1-K)^*eZ_{off} \quad (2)$$

13. The plasma processing apparatus of claim 1,
wherein one of the first high frequency power and the second high frequency power has a frequency suitable for plasma generation, and
the other of the first high frequency power and the second high frequency power has a frequency suitable for ion attraction into the processing target object from the plasma.

* * * * *